United States Patent
Foret

(10) Patent No.: US 9,790,108 B2
(45) Date of Patent: *Oct. 17, 2017

(54) WATER/WASTEWATER RECYCLE AND REUSE WITH PLASMA, ACTIVATED CARBON AND ENERGY SYSTEM

(71) Applicant: Foret Plasma Labs, LLC, The Woodlands, TX (US)

(72) Inventor: Todd Foret, The Woodlands, TX (US)

(73) Assignee: Foret Plasma Labs, LLC, The Woodlands, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/987,066

(22) Filed: Jan. 4, 2016

(65) Prior Publication Data
US 2016/0115048 A1 Apr. 28, 2016

Related U.S. Application Data

(60) Division of application No. 14/216,892, filed on Mar. 17, 2014, now Pat. No. 9,230,777, and a
(Continued)

(51) Int. Cl.
*C02F 1/461* (2006.01)
*H05H 1/34* (2006.01)
(Continued)

(52) U.S. Cl.
CPC ........... *C02F 1/46104* (2013.01); *C01B 3/34* (2013.01); *C01B 3/342* (2013.01); *C02F 1/4608* (2013.01);
(Continued)

(58) Field of Classification Search
None
See application file for complete search history.

(56) References Cited

U.S. PATENT DOCUMENTS 481,979 A 9/1892 Stanley
501,732 A 7/1893 Roeske
(Continued)

FOREIGN PATENT DOCUMENTS

CN 101905196 A 12/2010
CN 202224255 U 5/2012
(Continued)

OTHER PUBLICATIONS

Extended European Search Report [EP 13862561.1] dated Jul. 7, 2016.
(Continued)

*Primary Examiner* — Ashok Patel
(74) *Attorney, Agent, or Firm* — Daniel J. Chalker; Edwin S. Flores; Chalker Flores, LLP

(57) ABSTRACT

The present invention provides a system that includes a glow discharge cell and a plasma arc torch. A first valve is connected to a wastewater source. An eductor has a first inlet, a second inlet and an outlet, wherein the first inlet is connected to the outlet of the electrically conductive cylindrical vessel, the second inlet is connected to the first valve, and the outlet is connected to the tangential inlet of the plasma arc torch. A second valve is connected between the tangential outlet of the plasma arc torch and the inlet of the glow discharge cell, such that the plasma arc torch provides the electrically conductive fluid to the glow discharge cell and the glow discharge cell provides a treated water via the outlet centered in the closed second end.

11 Claims, 12 Drawing Sheets

Related U.S. Application Data continuation-in-part of application No. 13/586,449, filed on Aug. 15, 2012, now Pat. No. 9,111,712, which is a continuation of application No. 12/371,575, filed on Feb. 13, 2009, now Pat. No. 8,278,810, which is a continuation-in-part of application No. 12/288,170, filed on Oct. 16, 2008, now Pat. No. 9,051,820, said application No. 12/371,575 is a continuation-in-part of application No. 12/370,591, filed on Feb. 12, 2009, now Pat. No. 8,074,439.

(60) Provisional application No. 61/787,185, filed on Mar. 15, 2013, provisional application No. 60/980,443, filed on Oct. 16, 2007, provisional application No. 61/028,386, filed on Feb. 13, 2008, provisional application No. 61/027,879, filed on Feb. 12, 2008, provisional application No. 61/028,386, filed on Feb. 13, 2008.

(51) Int. Cl.

| | | |
|---|---|---|
| *C01B 3/34* | (2006.01) | |
| *C02F 1/28* | (2006.01) | |
| *H01J 37/32* | (2006.01) | |
| *H05H 1/42* | (2006.01) | |
| *H05H 1/48* | (2006.01) | |
| *C10J 3/72* | (2006.01) | |
| *C02F 1/46* | (2006.01) | |
| *H05H 1/24* | (2006.01) | |
| *B23K 10/00* | (2006.01) | |
| *C02F 1/32* | (2006.01) | |
| *C02F 1/78* | (2006.01) | |

(52) U.S. Cl.
CPC .............. *C02F 1/46114* (2013.01); *C10J 3/72* (2013.01); *H01J 37/32018* (2013.01); *H01J 37/32027* (2013.01); *H01J 37/32055* (2013.01); *H05H 1/34* (2013.01); *H05H 1/3405* (2013.01); *H05H 1/42* (2013.01); *H05H 1/48* (2013.01); *B23K 10/00* (2013.01); *C01B 2203/0216* (2013.01); *C01B 2203/0283* (2013.01); *C01B 2203/0861* (2013.01); *C01B 2203/1241* (2013.01); *C02F 1/283* (2013.01); *C02F 1/32* (2013.01); *C02F 1/78* (2013.01); *C02F 2301/026* (2013.01); *C02F 2303/16* (2013.01); *C10J 2200/12* (2013.01); *C10J 2300/0916* (2013.01); *C10J 2300/1238* (2013.01); *H05H 1/24* (2013.01); *H05H 2001/3489* (2013.01); *Y02W 10/33* (2015.05); *Y02W 10/37* (2015.05)

(56) References Cited

U.S. PATENT DOCUMENTS

| | | |
|---|---|---|
| 2,784,294 A | 3/1957 | Gravert |
| 2,898,441 A | 8/1959 | Reed et al. |
| 2,923,809 A | 2/1960 | Clews et al. |
| 3,004,189 A | 10/1961 | Giannini |
| 3,082,314 A | 3/1963 | Arata et al. |
| 3,131,288 A | 4/1964 | Browning et al. |
| 3,242,305 A | 3/1966 | Kane et al. |
| 3,522,846 A | 8/1970 | New |
| 3,534,388 A | 10/1970 | Ito et al. |
| 3,567,898 A | 3/1971 | Fein |
| 3,619,549 A | 11/1971 | Hogan et al. |
| 3,641,308 A | 2/1972 | Couch, Jr. et al. |
| 3,787,247 A | 1/1974 | Couch, Jr. |
| 3,798,784 A | 3/1974 | Kovats et al. |
| 3,830,428 A | 8/1974 | Dyos |
| 3,833,787 A | 9/1974 | Couch, Jr. |
| 4,067,390 A | 1/1978 | Camacho et al. |
| 4,169,503 A | 10/1979 | Scott |
| 4,203,022 A | 5/1980 | Couch, Jr. et al. |
| 4,265,747 A | 5/1981 | Copa et al. |
| 4,311,897 A | 1/1982 | Yerushalmy |
| 4,344,839 A | 8/1982 | Pachkowski et al. |
| 4,463,245 A | 7/1984 | McNeil |
| 4,531,043 A | 7/1985 | Zverina et al. |
| 4,567,346 A | 1/1986 | Marhic |
| 4,624,765 A | 11/1986 | Cerkanowicz et al. |
| 4,685,963 A | 8/1987 | Saville |
| 4,776,638 A | 10/1988 | Hahn |
| 4,791,268 A | 12/1988 | Sanders et al. |
| 4,886,118 A | 12/1989 | Van Meurs et al. |
| 5,019,268 A | 5/1991 | Rogalla |
| 5,048,404 A | 9/1991 | Bushnell et al. |
| 5,082,054 A | 1/1992 | Kiamanesh |
| 5,132,512 A | 7/1992 | Sanders et al. |
| 5,166,950 A | 11/1992 | Jouvaud et al. |
| 5,326,530 A | 7/1994 | Bridges |
| 5,348,629 A | 9/1994 | Khudenko |
| 5,368,724 A | 11/1994 | Ayres et al. |
| 5,534,232 A | 7/1996 | Denes et al. |
| 5,609,736 A | 3/1997 | Yamamoto |
| 5,609,777 A | 3/1997 | Apunevich et al. |
| 5,655,210 A | 8/1997 | Gregoire et al. |
| 5,660,743 A | 8/1997 | Nemchinsky |
| 5,738,170 A | 4/1998 | Laverhne |
| 5,746,984 A | 5/1998 | Hoard |
| 5,760,363 A | 6/1998 | Hackett et al. |
| 5,766,447 A | 6/1998 | Creijghton |
| 5,876,663 A | 3/1999 | Laroussi |
| 5,879,555 A | 3/1999 | Khudenko |
| 5,893,979 A | 4/1999 | Held |
| 5,908,539 A | 6/1999 | Young et al. |
| 5,979,551 A | 11/1999 | Uban et al. |
| 6,007,681 A | 12/1999 | Kawamura et al. |
| 6,117,401 A | 9/2000 | Juvan |
| 6,228,266 B1 | 5/2001 | Shim |
| 6,514,469 B1 | 2/2003 | Kado et al. |
| 6,749,759 B2 | 6/2004 | Denes et al. |
| 6,929,067 B2 | 8/2005 | Vinegar et al. |
| 6,942,786 B1 | 9/2005 | Fosseng |
| 6,987,792 B2 | 1/2006 | Do et al. |
| 7,081,171 B1 | 7/2006 | Sabol et al. |
| 7,086,468 B2 | 8/2006 | de Rouffignac et al. |
| 7,096,953 B2 | 8/2006 | de Rouffignac et al. |
| 7,121,342 B2 | 10/2006 | Vinegar et al. |
| 7,128,816 B2 | 10/2006 | Denes et al. |
| 7,422,695 B2 | 9/2008 | Foret |
| 7,536,975 B2 | 5/2009 | Denes et al. |
| 7,857,972 B2 | 12/2010 | Foret |
| 7,893,408 B2 | 2/2011 | Hieftje et al. |
| 8,074,439 B2 | 12/2011 | Foret |
| 8,278,810 B2 | 10/2012 | Foret |
| 8,568,663 B2 | 10/2013 | Foret |
| 8,810,122 B2 | 8/2014 | Foret |
| 8,833,054 B2 | 9/2014 | Foret |
| 8,904,749 B2 | 12/2014 | Foret |
| 9,051,820 B2 | 6/2015 | Foret |
| 9,105,433 B2 * | 8/2015 | Foret ..................... H05H 1/24 |
| 9,111,712 B2 * | 8/2015 | Foret ..................... H05H 1/24 |
| 9,230,777 B2 * | 1/2016 | Foret ................. H01J 37/32055 |
| 2002/0148562 A1 | 10/2002 | Aoyagi et al. |
| 2003/0024806 A1 | 2/2003 | Foret |
| 2003/0101936 A1 | 6/2003 | Lee |
| 2003/0150325 A1 | 8/2003 | Hyppanen |
| 2003/0179536 A1 | 9/2003 | Stevenson et al. |
| 2003/0213604 A1 | 11/2003 | Stevenson et al. |
| 2004/0020188 A1 | 2/2004 | Kramer et al. |
| 2005/0087435 A1 | 4/2005 | Kong et al. |
| 2005/0151455 A1 | 7/2005 | Sato et al. |
| 2005/0155373 A1 | 7/2005 | Hirooka et al. |
| 2006/0104849 A1 | 5/2006 | Tada et al. |
| 2006/0151445 A1 | 7/2006 | Schneider |
| 2006/0196424 A1 | 9/2006 | Swallow et al. |
| 2007/0104610 A1 | 5/2007 | Houston et al. |
| 2007/0196249 A1 | 8/2007 | Fridman et al. |
| 2007/0240975 A1 | 10/2007 | Foret |

(56) References Cited

U.S. PATENT DOCUMENTS

| | | |
|---|---|---|
| 2007/0253874 A1 | 11/2007 | Foret |
| 2008/0058228 A1 | 3/2008 | Wilson |
| 2008/0202915 A1 | 8/2008 | Hieftje et al. |
| 2009/0118145 A1 | 5/2009 | Wilson et al. |
| 2009/0200032 A1 | 8/2009 | Foret |
| 2009/0235637 A1 | 9/2009 | Foret |
| 2009/0277774 A1 | 11/2009 | Foret |
| 2010/0212498 A1 | 8/2010 | Salazar |
| 2010/0258429 A1 | 10/2010 | Ugolin |
| 2010/0296977 A1 | 11/2010 | Hancock |
| 2011/0005999 A1 | 1/2011 | Randal |
| 2011/0022043 A1 | 1/2011 | Wandke et al. |
| 2011/0031224 A1 | 2/2011 | Severance, Jr. et al. |
| 2011/0223091 A1 | 9/2011 | Miller et al. |
| 2011/0225948 A1 | 9/2011 | Valeev et al. |
| 2011/0303532 A1 | 12/2011 | Foret |
| 2012/0097648 A1 | 4/2012 | Foret |
| 2012/0205293 A1 | 8/2012 | Thanoo |
| 2012/0227968 A1 | 9/2012 | Eldred et al. |
| 2013/0020926 A1 | 1/2013 | Foret |

FOREIGN PATENT DOCUMENTS

| | | |
|---|---|---|
| EP | 1707096 A2 | 10/2006 |
| EP | 1915940 A1 | 4/2008 |
| GB | 1224638 A | 3/1971 |
| JP | 2006-501980 A | 1/2006 |
| JP | 2008238053 A | 10/2008 |
| KR | 1999009569 A | 2/1999 |
| KR | 2004-0005107 A | 1/2004 |
| WO | 9904607 A1 | 1/1999 |
| WO | 2007117634 A2 | 10/2007 |

OTHER PUBLICATIONS

Belani, A., "It's Time for an Industry Initiative on Heavy Oil," JPT Online accessed on Oct. 16, 2007 at http://www.spe.org/spe-app/spe/jpt/2006/06/mangement_heavy_oil.htm.

Brandt, A. R., "Converting Green River oil shale to liquid fuels with Alberta Taciuk Processor: energy inputs andgreenhouse gas emissions,""Jun. 1, 2007".

Brandt, A. R., "Converting Green River oil shale to liquid fuels with the Shell in-situ conversion process: energy inputs and greenhouse gas emissions," Jun. 30, 2007.

International Search Report [KIPO] PCT/US201/062941 dated Jan. 27, 2014.

International Search Report and Written Opinion for PCT/US2008/011926 dated Apr. 27, 2009.

International Search Report and Written Opinion for PCT/US2009/000937 dated Sep. 17, 2009.

Kavan, L., "Electrochemical Carbon," Chem Rev (1997), 97:3061-3082.

Understanding in-situ combustion, www.HeavyOilinfo.com, accessed Oct. 16, 2007.

Unleashing the potential: Heavy Oil, Supplement to E&P Annual Reference Guide, www.eandp.info.com, Jun. 2007.

PCT/US2014/2014/024991 [KIPO] International Search Report dated Aug. 6, 2014.

PCT/US2014/030090 [KIPO] International Search Report dated Sep. 25, 2014.

International Search Report and Written Opinion for PCT/US2009/033979 dated Sep. 15, 2009.

Metalliferous Mining—Processing Cyclones Resource Book—Aug. 2010, provided at https://rsteyn.files.wordpress.com/2010/07/cyclones-basics.pdf.

* cited by examiner

Fig. 10 - Tailings Pond Water Results

FIG 10 (Continued)

| Pb | Se | Mn | U | V | Zn | Ti | Appearance: |
|---|---|---|---|---|---|---|---|
| 0.0 | 3.0 | 12.0 | 14.0 | 7.4 | 20.2 | 1.7 | Colorless, slightly cloudy Settlable fines |
| 0.0 | 3.4 | 0.0 | 0.0 | 0.0 | 1.6 | 0.0 | Clear, yellowish or brownish |
| 0.0 | 2.7 | 4.2 | 2.2 | 1.3 | 13.4 | 0.0 | Clear, yellowish or brownish |
| 0.0 | 2.0 | 18.6 | 12.0 | 5.4 | 49.6 | 13.7 | Very light green |
| 0.0 | 1.3 | 112.7 | 41.1 | 26.4 | 354.4 | 7.7 | Dark green, with sediment |
|  |  |  |  |  |  |  |  |

| 0 | 0 | 9 | 3 | 4 | 18 | 5 |
| 0 | 0 | 7 | 1 | 2 | 24 | 0 |

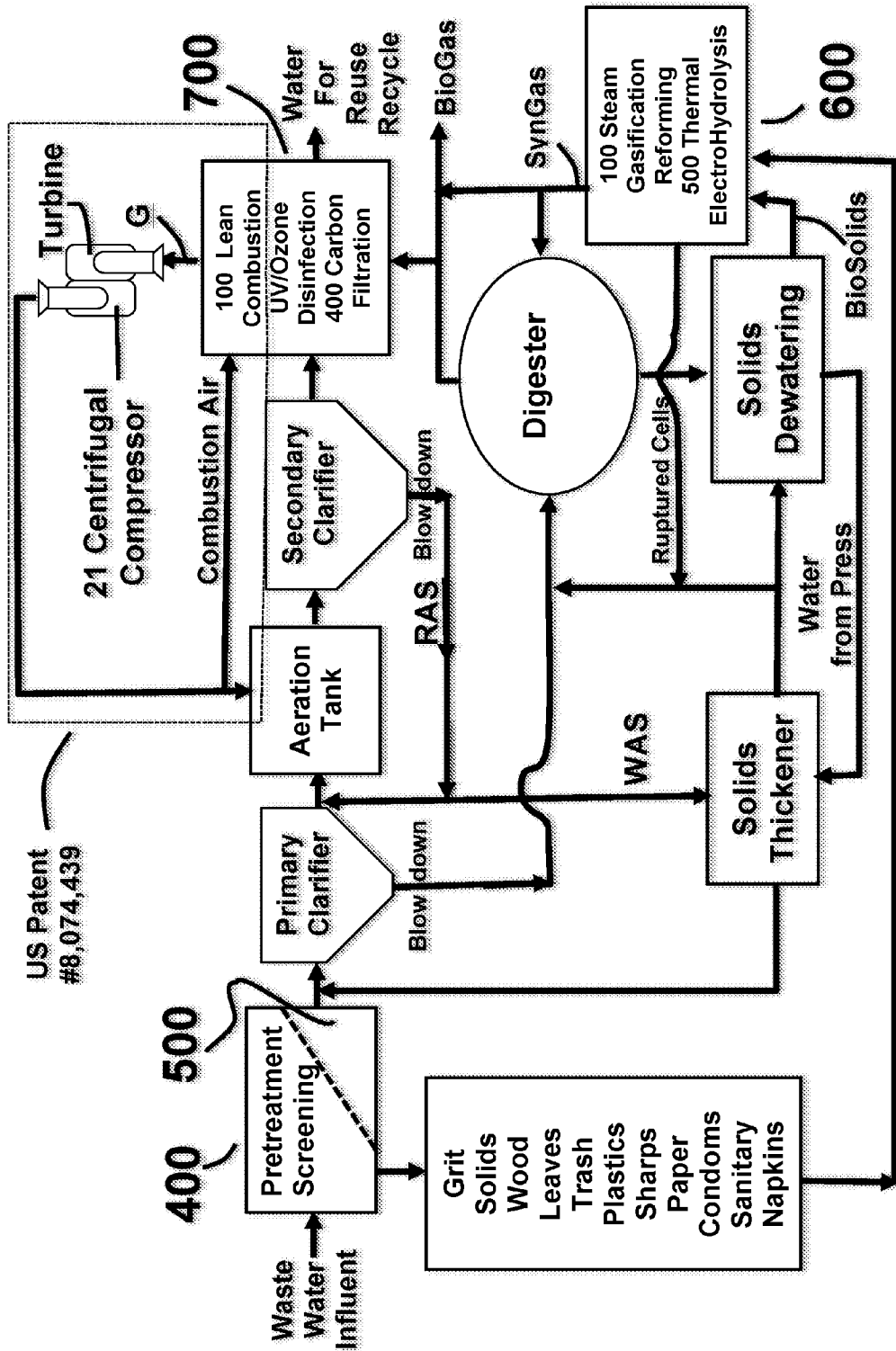

Representative Activated Sludge Wastewater Treatment Process Sequence (with Typical Daily Electricity Consumption for a 10 Million Gallons/Day Facility)

Source: EPRI [1]

WATER/WASTEWATER RECYCLE AND REUSE WITH PLASMA, ACTIVATED CARBON AND ENERGY SYSTEM

PRIORITY CLAIM AND CROSS-REFERENCE TO RELATED APPLICATIONS

This patent application claims priority to and is a divisional application of U.S. patent application Ser. No. 14/216,892 filed on Mar. 17, 2014, now U.S. Pat. No. 9,230,777, which is: (1) a non-provisional patent application of U.S. Provisional Patent Application Ser. No. 61/787,185 filed on Mar. 15, 2013; and (2) a continuation-in-part of U.S. patent application Ser. No. 13/586,449 filed on Aug. 15, 2012, now U.S. Pat. No. 9,111,712 which is a continuation application of U.S. patent application Ser. No. 12/371,575 filed on Feb. 13, 2009, now U.S. Pat. No. 8,278,810, which is: (a) a continuation-in-part application of U.S. patent application Ser. No. 12/288,170 filed on Oct. 16, 2008, now U.S. Pat. No. 9,051,820 which is a non-provisional application of U.S. Provisional Patent Application Ser. No. 60/980,443 filed on Oct. 16, 2007 and U.S. Provisional Patent Application Ser. No. 61/028,386 filed on Feb. 13, 2008; (b) a continuation-in-part application of U.S. patent application Ser. No. 12/370,591 filed on Feb. 12, 2009, now U.S. Pat. No. 8,074,439, which is non-provisional patent application of U.S. Provisional Patent Application Ser. No. 61/027,879 filed on Feb. 12, 2008; and (c) a non-provisional patent application of U.S. Provisional Patent Application Ser. No. 61/028,386 filed on Feb. 13, 2008.

The entire contents of the foregoing applications are hereby incorporated herein by reference. This application is also related to U.S. Pat. No. 7,422,695 and U.S. Pat. No. 7,857,972 and multiple patents and patent application that claim priority thereto.

FIELD OF THE INVENTION

The present invention relates generally to solid oxide electrolysis cells and plasma torches. More specifically, the present invention relates to a water/wastewater recycle and reuse with plasma, activated carbon and energy system.

BACKGROUND OF THE INVENTION

Glow discharge and plasma systems are becoming ever more present with the emphasis on renewable fuels, pollution prevention, clean water and more efficient processing methods. Glow discharge is also referred to as electroplasma, plasma electrolysis and high temperature electrolysis. In liquid glow discharge systems a plasma sheath is formed around the cathode located within an electrolysis cell.

U.S. Pat. No. 6,228,266 discloses a water treatment apparatus using a plasma reactor and a method of water treatment. The apparatus includes a housing having a polluted water inlet and a polluted water outlet; a plurality of beads (e.g., nylon and other plastic type beads) filled into the interior of the housing; a pair of electrodes, one of the electrodes contacting with the bottom of the housing, another of the electrodes contacting an upper portion of the uppermost beads; and a pulse generator connected with the electrodes by a power cable for generating pulses. Some drawbacks of the '266 plasma reactor are the requirements of an extremely high voltage pulse generator (30 KW to 150 KW), a plurality of various beads in a web shape and operating the reactor full from top to bottom. Likewise, the plasma reactor is not designed for separating a gas from the bulk liquid, nor can it recover heat or generate hydrogen. In fact, the addition of air to the plasma reactor completely defeats the sole purpose of current research for generating hydrogen via electrolysis or plasma or a combination of both. If any hydrogen is generated within the plasma reactor, the addition of air will cause the hydrogen to react with oxygen and form water. Also, there is no mention of any means for generating heat by cooling the cathode. Likewise, there is no mention of cooking organics unto the beads, nor the ability to reboil and concentrate liquids (e.g., spent acids, black liquor, etc.), or recovering caustic and sulfides from black liquor.

The following is a list of prior art similar to the '266 patent:

| Pat. No. | Title |
| --- | --- |
| 481,979 | Apparatus for electrically purifying water |
| 501,732 | Method of an apparatus for purifying water |
| 3,798,784 | Process and apparatus for the treatment of moist materials |
| 4,265,747 | Disinfection and purification of fluids using focused laser radiation |
| 4,624,765 | Separation of dispersed liquid phase from continuous fluid phase |
| 5,019,268 | Method and apparatus for purifying waste water |
| 5,048,404 | High pulsed voltage systems for extending the shelf life of pumpable food products |
| 5,326,530 | High pulsed voltage systems for extending the shelf life of pumpable food products |
| 5,348,629 | Method and apparatus for electrolytic processing of materials |
| 5,368,724 | Apparatus for treating a confined liquid by means of a pulse electrical discharge |
| 5,655,210 | Corona source for producing corona discharge and fluid waste treatment with corona discharge |
| 5,746,984 | Exhaust system with emissions storage device and plasma reactor |
| 5,879,555 | Electrochemical treatment of materials |
| 6,007,681 | Apparatus and method for treating exhaust gas and pulse generator used therefor |

Plasma arc torches are commonly used by fabricators, machine shops, welders and semi-conductor plants for cutting, gouging, welding, plasma spraying coatings and manufacturing wafers. The plasma torch is operated in one of two modes—transferred arc or non-transferred arc. The most common torch found in many welding shops is the transferred arc plasma torch. It is operated very similar to a DC welder in that a grounding clamp is attached to a workpiece. The operator, usually a welder, depresses a trigger on the plasma torch handle which forms a pilot arc between a centrally located cathode and an anode nozzle. When the operator brings the plasma torch pilot arc close to the workpiece the arc is transferred from the anode nozzle via the electrically conductive plasma to the workpiece. Hence the name transferred arc. The non-transferred arc plasma torch retains the arc within the torch. Quite simply the arc remains attached to the anode nozzle. This requires cooling the anode. Common non-transferred arc plasma torches have a heat rejection rate of 30%. In other words, 30% of the total torch power is rejected as heat.

A major drawback in using plasma torches is the cost of inert gases such as argon and hydrogen. There have been several attempts for forming the working or plasma gas within the torch itself by using rejected heat from the electrodes to generate steam from water. The objective is to increase the total efficiency of the torch as well as reduce plasma gas cost. However, there is not a single working example that can run continuous duty. For example, the Multiplaz torch (U.S. Pat. Nos. 6,087,616 and 6,156,994) is a small hand held torch that must be manually refilled with water. The Multiplaz torch is not a continuous use plasma torch.

Other prior art plasma torches are disclosed in the following patents.

| Pat. No. | Title |
|---|---|
| 3,567,898 | Plasma cutting torch |
| 3,830,428 | Plasma torches |
| 4,311,897 | Plasma arc torch and nozzle assembly |
| 4,531,043 | Method of and apparatus for stabilization of low-temperature plasma of an arc burner |
| 5,609,777 | Electric-arc plasma steam torch |
| 5,660,743 | Plasma arc torch having water injection nozzle assembly |

U.S. Pat. No. 4,791,268 discloses "an arc plasma torch includes a moveable cathode and a fixed anode which are automatically separated by the buildup of gas pressure within the torch after a current flow is established between the cathode and the anode. The gas pressure draws a nontransferred pilot arc to produce a plasma jet. The torch is thus contact started, not through contact with an external workpiece, but through internal contact of the cathode and anode. Once the pilot arc is drawn, the torch may be used in the nontransferred mode, or the arc may be easily transferred to a workpiece. In a preferred embodiment, the cathode has a piston part which slidingly moves within a cylinder when sufficient gas pressure is supplied. In another embodiment, the torch is a hand-held unit and permits control of current and gas flow with a single control."

Typically, and as disclosed in the '268 patent, plasma torch gas flow is set upstream of the torch with a pressure regulator and flow regulator. In addition to transferred arc and non-transferred arc, plasma arc torches can be defined by arc starting method. The high voltage method starts by using a high voltage to jump the arc from the centered cathode electrode to the shield nozzle. The blow-back arc starting method is similar to stick welding. For example, similar to a welder touching a grounded work-pieced then pulling back the electrode to form an arc, a blow-back torch uses the cutting gas to push the negative (−) cathode electrode away from the shield nozzle. Normally, in the blow-back torch a spring or compressed gas pushes the cathode towards the nozzle so that it resets to the start mode when not in operation.

The '268 plasma torch is a blow-back type torch that uses the contact starting method. Likewise, by depressing a button and/or trigger a current is allowed to flow through the torch and thus the torch is in a dead-short mode. Immediately thereafter, gas flowing within a blow-back contact starting torch pushes upon a piston to move the cathode away from the anode thus forming an arc. Voltage is set based upon the maximum distance the cathode can be pushed back from the anode. There are no means for controlling voltage. Likewise, this type of torch can only be operated in one mode—Plasma Arc. Backflowing material through the anode nozzle is not possible in the '268 plasma torch. Moreover, there is no disclosure of coupling this torch to a solid oxide glow discharge cell.

U.S. Pat. No. 4,463,245 discloses "A plasma torch (40) comprises a handle (41) having an upper end (41B) which houses the components forming a torch body (43). Body (33) incorporates a rod electrode (10) having an end which cooperates with an annular tip electrode (13) to form a spark gap. An ionizable fuel gas is fed to the spark gap via tube (44) within the handle (41), the gas from tube (44) flowing axially along rod electrode (10) and being diverted radially through apertures (16) so as to impinge upon and act as a coolant for a thin-walled portion (14) of the annular tip electrode (13). With this arrangement the heat generated by the electrical arc in the inter-electrode gap is substantially confined to the annular tip portion (13A) of electrode (13) which is both consumable and replaceable in that portion (13A) is secured by screw threads to the adjoining portion (13B) of electrode (13) and which is integral with the thin-walled portion (14)." Once again there is no disclosure of coupling this torch to a solid oxide glow discharge cell.

The following is a list of prior art teachings with respect to starting a torch and modes of operation.

| Pat. No. | Title |
|---|---|
| 2,784,294 | Welding torch |
| 2,898,441 | Arc torch push starting |
| 2,923,809 | Arc cutting of metals |
| 3,004,189 | Combination automatic-starting electrical plasma torch and gas shutoff valve |
| 3,082,314 | Plasma arc torch |
| 3,131,288 | Electric arc torch |
| 3,242,305 | Plasma retract arc torch |
| 3,534,388 | Arc torch cutting process |
| 3,619,549 | Arc torch cutting process |
| 3,641,308 | Plasma arc torch having liquid laminar flow jet for arc constriction |
| 3,787,247 | Water-scrubber cutting table |
| 3,833,787 | Plasma jet cutting torch having reduced noise generating characteristics |
| 4,203,022 | Method and apparatus for positioning a plasma arc cutting torch |
| 4,463,245 | Plasma cutting and welding torches with improved nozzle electrode cooling |
| 4,567,346 | Arc-striking method for a welding or cutting torch and a torch adapted to carry out said method |

High temperature steam electrolysis and glow discharge are two technologies that are currently being viewed as the future for the hydrogen economy. Likewise, coal gasification is being viewed as the technology of choice for reducing carbon, sulfur dioxide and mercury emissions from coal burning power plants. Renewables such as wind turbines, hydroelectric and biomass are being exploited in order to reduce global warming.

Water is one of our most valuable resources. Copious amounts of water are used in industrial processes with the end result of producing wastewater. Water treatment and wastewater treatment go hand in hand with the production of energy. When discussing water and energy within the same text it is commonly referred to as the water-energy nexus. It takes energy to produce water and it takes water to produce energy. Even renewable energy such as solar and wind require water, within the confines of manufacturing the photovoltaic panels, turbines, batteries and ancillary equipment required to generate, transfer and deliver renewable energy. Hence, the term Water-Energy Nexus.

The Water-Food Nexus is a rapidly emerging Worldwide issue, because both are required for all forms of life—plants and animals—for survival. Thus, drinking water sources for animals and irrigation water sources for plants that are stressed in drought stricken regions are now in dire need of reusing and recyling every drop of water, including black water from flushed toilets to effluent from wastewater treatment plants to ponds and tanks that animals wade into to stay cool. It is quite evident that drought stricken countries and regions would also benefit from a simple, inexpensive and energy efficient/recovery Point Of Use ("POE"), Point Of Entry ("POE") and Safe Drinking Water Storage ("SWS") system.

Therefore, there is a need for an advanced water treatment system for existing drinking water and wastewater treatment plants that also produces energy while producing a wastewater effluent safe for recycling as irrigation water and/or drinking water for livestock. More specifically, worldwide water treatment and wastewater treatment facilities are in dire need of a sustainable solution for onsite generation of energy for aeration, pumping, mixing and disinfecting water. A water/wastewater treatment system that could convert solid, liquid and/or gas carbonaceous matter from biomass and/or fossil fuels to rotational energy and char, such as biochar, charcoal, carbon black, black carbon and/or activated carbon, while providing UV Light and Ozone ($O_3$) for disinfection and advanced water treatment would open the door to a solution for the water and energy crisis facing the world.

SUMMARY OF THE INVENTION

In one embodiment, the present invention provides an advanced water treatment system for existing drinking water and wastewater treatment plants that also produces energy while producing a wastewater effluent safe for recycling as irrigation water and/or drinking water for livestock. In another embodiment, the present invention provides a sustainable solution for onsite generation of energy for aeration, pumping, mixing and disinfecting water. In yet another embodiment of the present invention, a water/wastewater treatment system can convert solid, liquid and/or gas carbonaceous matter from biomass and/or fossil fuels to rotational energy and char, such as biochar, charcoal, carbon black, black carbon and/or activated carbon, while providing UV Light and Ozone ($O_3$) for disinfection and advanced water treatment.

The present invention provides a means for coupling char production, energy recovery, UV Light, Ozone Generation, Activated Carbon Filtration and both activation and reactivation of Char. Energy recovery may be in the form of hot gases, hot water, steam generation, electrical generation, air or gas sparging, and/or rotational energy. More specifically, the present invention provides a means for plasma thermolytic char production, rotational energy, UV Light, Ozone Generation and Activated Carbon Filtration with reduced to near ZERO air emissions. The rotational energy may be used for rotating a compressor, pump, mixer, auger, press, shredder, electrical generator, alternator and/or any purpose that requires the use of rotational energy as a means for doing work. Very specifically, the present invention provides a plasma thermolytic means for converting Biomass to Plasma BioChar™ for carbon filtration purposes, while producing UV Light and Ozone from an electrical arc, in addition to converting and recovering the volatile gases from the plasma thermolytic conversion process into rotational energy, mixing and/or thermal energy. Concurrently, the present invention provides a means for pH control by directly mixing combustion gases produced from combustion of the volatile gases in addition, to production of acids and bases via glow discharge electrolysis for both pH control as well as carbon activation. In addition, the present invention provides a means for producing sodium hypochlorite ("bleach") for disinfection of drinking water as well as maintaining a free chlorine residual. The present invention includes a means for coupling water and wastewater treatment with generating and storage of renewable energy. Likewise, the present invention provides a means for coupling solar and wind energy generation with water treatment for solving a dire need in wind and solar power—load smoothing and ramp rate mitigation.

The present invention provides a system that includes a glow discharge cell and a plasma arc torch. The glow discharge cell includes an electrically conductive cylindrical vessel having a first end and a closed second end, an inlet proximate to the first end, and an outlet centered in the closed second end, a hollow electrode aligned with a longitudinal axis of the electrically conductive cylindrical vessel and extending at least from the first end into the electrically conductive cylindrical vessel, wherein the hollow electrode has an inlet and an outlet, a first insulator that seals the first end of the electrically conductive cylindrical vessel around the hollow electrode and maintains a substantially equidistant gap between the electrically conductive cylindrical vessel and the hollow electrode, and a non-conductive granular material disposed within the substantially equidistant gap, wherein the non-conductive granular material allows an electrically conductive fluid to flow between the electrically conductive cylindrical vessel and the hollow electrode, and the combination of the non-conductive granular material and the electrically conductive fluid prevents electrical arcing between the cylindrical vessel and the hollow electrode during an electric glow discharge. The plasma arc torch includes a cylindrical vessel having a first end and a second end, a tangential inlet connected to or proximate to the first end, a tangential outlet connected to or proximate to the second end, an electrode housing connected to the first end of the cylindrical vessel such that a first electrode is (a) aligned with a longitudinal axis of the cylindrical vessel, and (b) extends into the cylindrical vessel, a hollow electrode nozzle connected to the second end of the cylindrical vessel such that the center line of the hollow electrode nozzle is aligned with the longitudinal axis of the cylindrical vessel, and wherein the tangential inlet and the tangential outlet create a vortex within the cylindrical vessel, and the first electrode and the hollow electrode nozzle create a plasma that discharges through the hollow electrode nozzle. A first valve is connected to a wastewater source. An eductor has a first inlet, a second inlet and an outlet, wherein the first inlet is connected to the outlet of the electrically conductive cylindrical vessel, the second inlet is connected to the first valve, and the outlet is connected to the tangential inlet of the plasma arc torch. A second valve is connected between the tangential outlet of the plasma arc torch and the inlet of the glow discharge cell, such that the plasma arc torch provides the electrically conductive fluid to the glow discharge cell and the glow discharge cell provides a treated water via the outlet centered in the closed second end.

The present invention also provides a system that includes a glow discharge cell and a plasma arc torch. The glow discharge cell includes an electrically conductive cylindrical vessel having a first end and a closed second end, an inlet proximate to the first end, and an outlet centered in the closed second end, a hollow electrode aligned with a longitudinal axis of the electrically conductive cylindrical vessel and extending at least from the first end into the electrically conductive cylindrical vessel, wherein the hollow electrode has an inlet and an outlet, a first insulator that seals the first end of the electrically conductive cylindrical vessel around the hollow electrode and maintains a substantially equidistant gap between the electrically conductive cylindrical vessel and the hollow electrode, and a non-conductive granular material disposed within the substantially equidistant gap, wherein the non-conductive granular material allows an electrically conductive fluid to flow between the electrically conductive cylindrical vessel and the hollow electrode, and the combination of the non-conductive granular material and the electrically conductive fluid prevents electrical arcing between the cylindrical vessel and the hollow electrode during an electric glow discharge. The plasma arc torch includes a cylindrical vessel having a first end and a second end, a tangential inlet connected to or proximate to the first end, a tangential outlet connected to or proximate to the second end, an electrode housing connected to the first end of the cylindrical vessel such that a first electrode is (a) aligned with a longitudinal axis of the cylindrical vessel, and (b) extends into the cylindrical vessel, a hollow electrode nozzle connected to the second end of the cylindrical vessel such that the center line of the hollow electrode nozzle is aligned with the longitudinal axis of the cylindrical vessel, and wherein the tangential inlet and the tangential outlet create a vortex within the cylindrical vessel, and the first electrode and the hollow electrode nozzle create a plasma that discharges through the hollow electrode nozzle. A linear actuator is connected to the first electrode of the plasma arc torch to adjust a position of the first electrode within the cylindrical vessel along the longitudinal axis of the cylindrical vessel. A pump is connected to a wastewater source. A first valve is connected to the pump. A compressed gas source is connected to the first valve. A third valve is connected between the outlet of the electrically conductive cylindrical vessel. An eductor has a first inlet, a second inlet and an outlet, wherein the first inlet is connected to the third valve, the second inlet is connected to the first valve, and the outlet is connected to the tangential inlet of the plasma arc torch. A second valve is connected between the tangential outlet of the plasma arc torch and the inlet of the glow discharge cell, such that the plasma arc torch provides the electrically conductive fluid to the glow discharge cell and the glow discharge cell provides a treated water via the outlet centered in the closed second end.

The present invention is described in detail below with reference to the accompanying drawings.

BRIEF DESCRIPTION OF THE DRAWINGS

The above and further advantages of the invention may be better understood by referring to the following description in conjunction with the accompanying drawings, in which:

FIG. 10 is a table showing the results of the tailings pond water and solids analysis treated with one embodiment of the present invention;

FIG. 12 is block diagram of a water/wastewater treatment plant recycle and reuse system in accordance with another embodiment of the present invention.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

Figure 1:
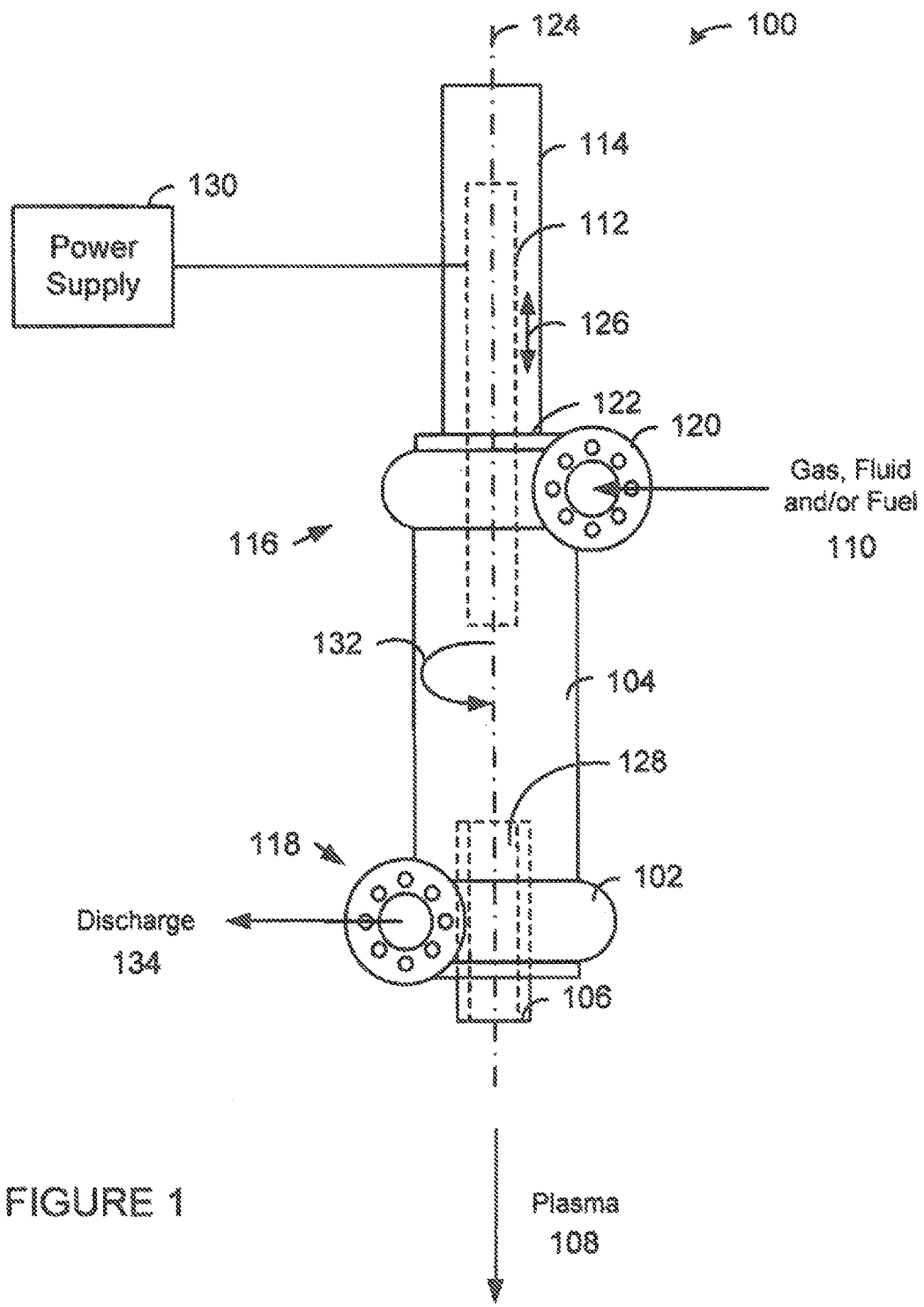
FIG. 1 is a diagram of a plasma arc torch in accordance with one embodiment of the present invention.

Now referring to FIG. 1, a plasma arc torch 100 in accordance with one embodiment of the present invention is shown. The plasma arc torch 100 is a modified version of the ARCWHIRL® device disclosed in U.S. Pat. No. 7,422,695 (which is hereby incorporated by reference in its entirety) that produces unexpected results. More specifically, by attaching a discharge volute 102 to the bottom of the vessel 104, closing off the vortex finder, replacing the bottom electrode with a hollow electrode nozzle 106, an electrical arc can be maintained while discharging plasma 108 through the hollow electrode nozzle 106 regardless of how much gas (e.g., air), fluid (e.g., water) or steam 110 is injected into plasma arc torch 100. In addition, when a valve (not shown) is connected to the discharge volute 102, the mass flow of plasma 108 discharged from the hollow electrode nozzle 106 can be controlled by throttling the valve (not shown) while adjusting the position of the first electrode 112 using the linear actuator 114.

As a result, plasma arc torch 100 includes a cylindrical vessel 104 having a first end 116 and a second end 118. A tangential inlet 120 is connected to or proximate to the first end 116 and a tangential outlet 102 (discharge volute) is connected to or proximate to the second end 118. An electrode housing 122 is connected to the first end 116 of the cylindrical vessel 104 such that a first electrode 112 is aligned with the longitudinal axis 124 of the cylindrical vessel 104, extends into the cylindrical vessel 104, and can be moved along the longitudinal axis 124. Moreover, a linear actuator 114 is connected to the first electrode 112 to adjust the position of the first electrode 112 within the cylindrical vessel 104 along the longitudinal axis of the cylindrical vessel 124 as indicated by arrows 126. The hollow electrode nozzle 106 is connected to the second end 118 of the cylindrical vessel 104 such that the center line of the hollow electrode nozzle 106 is aligned with the longitudinal axis 124 of the cylindrical vessel 104. The shape of the hollow portion 128 of the hollow electrode nozzle 106 can be cylindrical or conical. Moreover, the hollow electrode nozzle 106 can extend to the second end 118 of the cylindrical vessel 104 or extend into the cylindrical vessel 104 as shown. As shown in FIG. 1, the tangential inlet 120 is volute attached to the first end 116 of the cylindrical vessel 104, the tangential outlet 102 is a volute attached to the second end 118 of the cylindrical vessel 104, the electrode housing 122 is connected to the inlet volute 120, and the hollow electrode nozzle 106 (cylindrical configuration) is connected to the discharge volute 102. Note that the plasma arc torch 100 is not shown to scale.

A power supply 130 is electrically connected to the plasma arc torch 100 such that the first electrode 112 serves as the cathode and the hollow electrode nozzle 106 serves as the anode. The voltage, power and type of the power supply 130 is dependant upon the size, configuration and function of the plasma arc torch 100. A gas (e.g., air), fluid (e.g., water) or steam 110 is introduced into the tangential inlet 120 to form a vortex 132 within the cylindrical vessel 104 and exit through the tangential outlet 102 as discharge 134. The vortex 132 confines the plasma 108 within in the vessel 104 by the inertia (inertial confinement as opposed to magnetic confinement) caused by the angular momentum of the vortex, whirling, cyclonic or swirling flow of the gas (e.g., air), fluid (e.g., water) or steam 110 around the interior of the cylindrical vessel 104. During startup, the linear actuator 114 moves the first electrode 112 into contact with the hollow electrode nozzle 106 and then draws the first electrode 112 back to create an electrical arc which forms the plasma 108 that is discharged through the hollow electrode nozzle 106. During operation, the linear actuator 114 can adjust the position of the first electrode 112 to change the plasma 108 discharge or account for extended use of the first electrode 112.

Figure 2:
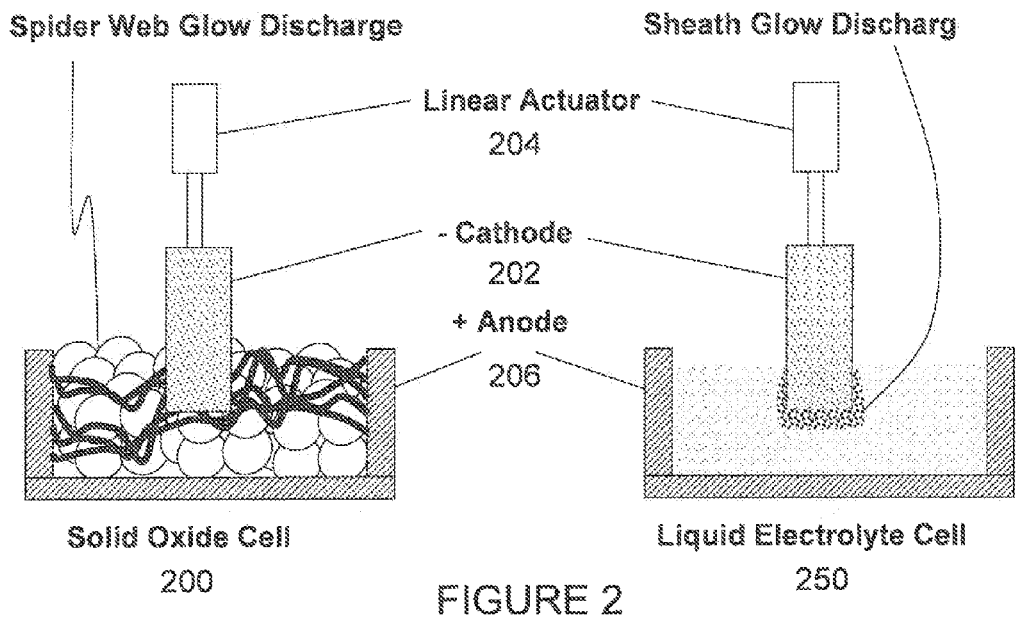
FIG. 2 is a cross-sectional view comparing and contrasting a solid oxide cell to a liquid electrolyte cell in accordance with one embodiment of the present invention.

Referring now to FIG. 2, a cross-sectional view comparing and contrasting a solid oxide cell 200 to a liquid electrolyte cell 250 in accordance with one embodiment of the present invention is shown. An experiment was conducted using the Liquid Electrolyte Cell 250. A carbon cathode 202 was connected to a linear actuator 204 in order to raise and lower the cathode 202 into a carbon anode crucible 206. An ESAB ESP 150 DC power supply rated at 150 amps and an open circuit voltage ("OCV") of 370 VDC was used for the test. The power supply was "tricked out" in order to operate at OCV.

In order to determine the sheath glow discharge length on the cathode 202 as well as measure amps and volts the power supply was turned on and then the linear actuator 204 was used to lower the cathode 202 into an electrolyte solution of water and baking soda. Although a steady glow discharge could be obtained the voltage and amps were too erratic to record. Likewise, the power supply constantly surged and pulsed due to erratic current flow. As soon as the cathode 202 was lowered too deep, the glow discharge ceased and the cell went into an electrolysis mode. In addition, since boiling would occur quite rapidly and the electrolyte would foam up and go over the sides of the carbon crucible 206, foundry sand was added reduce the foam in the crucible 206.

The 8" diameter anode crucible 206 was filled with sand and the electrolyte was added to the crucible. Power was turned on and the cathode 202 was lowered into the sand and electrolyte. Unexpectedly, a glow discharge was formed immediately, but this time it appeared to spread out laterally from the cathode 202. A large amount of steam was produced such that it could not be seen how far the glow discharge had extended through the sand.

Figure 3:
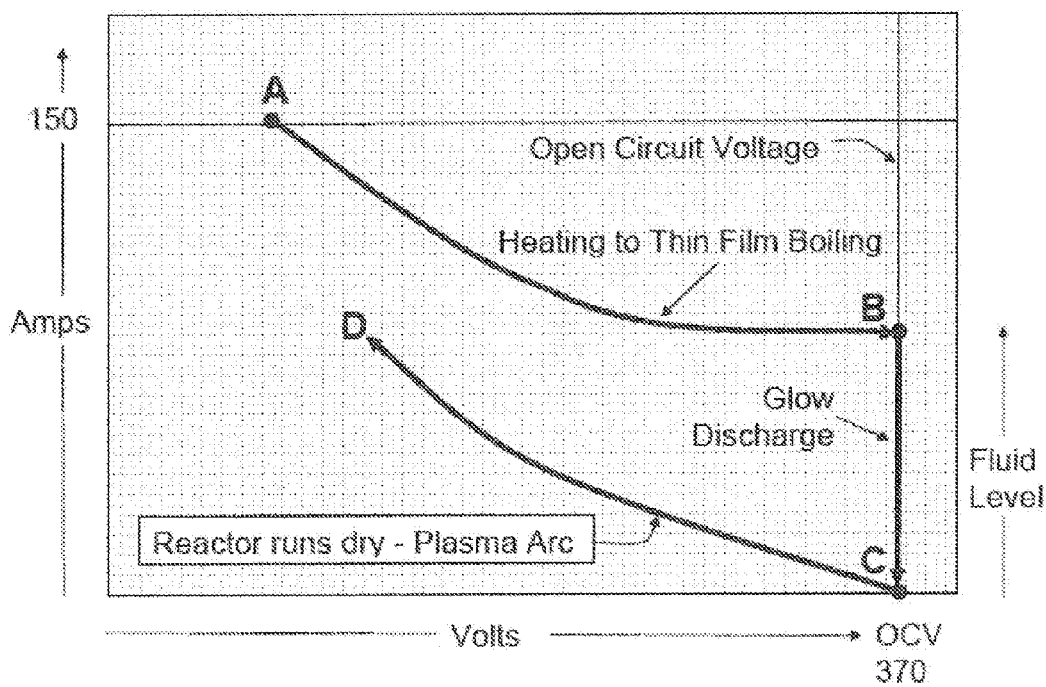
FIG. 3 is a graph showing an operating curve a glow discharge cell in accordance with one embodiment of the present invention.

Next, the sand was replaced with commonly available clear floral marbles. When the cathode 202 was lowered into the marbles and baking soda/water solution, the electrolyte began to slowly boil. As soon as the electrolyte began to boil a glow discharge spider web could be seen throughout the marbles as shown the Solid Oxide Cell 200. Although this was completely unexpected at a much lower voltage than what has been disclosed and published, what was completely unexpected is that the DC power supply did not surge, pulse or operate erratically in any way. A graph showing an operating curve for a glow discharge cell in accordance with the present invention is shown in FIG. 3 based on various tests. The data is completely different from what is currently published with respect to glow discharge graphs and curves developed from currently known electro-plasma, plasma electrolysis or glow discharge reactors. Glow discharge cells can evaporate or concentrate liquids while generating steam.

Figure 4:
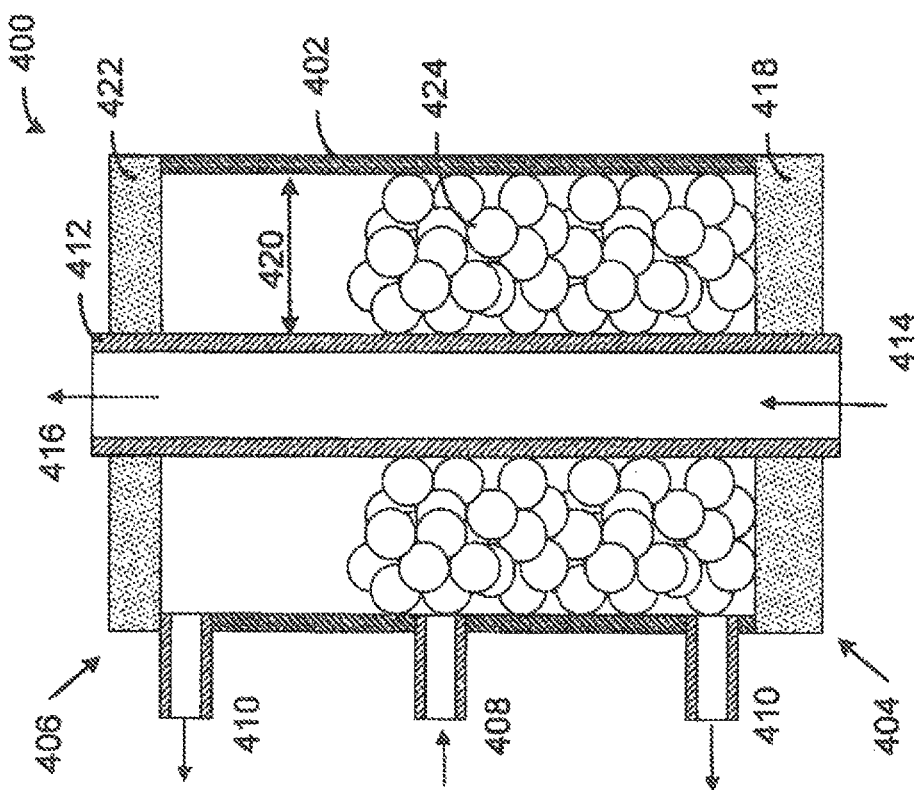
FIG. 4 is a cross-sectional view of a glow discharge cell in accordance with one embodiment of the present invention.

Now referring to FIG. 4, a cross-sectional view of a glow discharge cell 400 in accordance with one embodiment of the present invention is shown. The glow discharge cell 400 includes an electrically conductive cylindrical vessel 402 having a first end 404 and a second end 406, and at least one inlet 408 and one outlet 410. A hollow electrode 412 is aligned with a longitudinal axis of the cylindrical vessel 402 and extends at least from the first end 404 to the second end 406 of the cylindrical vessel 402. The hollow electrode 412 also has an inlet 414 and an outlet 416. A first insulator 418 seals the first end 404 of the cylindrical vessel 402 around the hollow electrode 412 and maintains a substantially equidistant gap 420 between the cylindrical vessel 402 and the hollow electrode 412. A second insulator 422 seals the second end 406 of the cylindrical vessel 402 around the hollow electrode 412 and maintains the substantially equidistant gap 420 between the cylindrical vessel 402 and the hollow electrode 412. A non-conductive granular material 424 is disposed within the gap 420, wherein the non-conductive granular material 424 (a) allows an electrically conductive fluid to flow between the cylindrical vessel 402 and the hollow electrode 412, and (b) prevents electrical arcing between the cylindrical vessel 402 and the hollow electrode 412 during a electric glow discharge. The electric glow discharge is created whenever: (a) the glow discharge cell 400 is connected to an electrical power source such that the cylindrical vessel 402 is an anode and the hollow electrode 412 is a cathode, and (b) the electrically conductive fluid is introduced into the gap 420.

The vessel 402 can be made of stainless steel and the hollow electrode can be made of carbon. The non-conductive granular material 424 can be marbles, ceramic beads, molecular sieve media, sand, limestone, activated carbon, zeolite, zirconium, alumina, rock salt, nut shell or wood chips. The electrical power supply can operate in a range from 50 to 500 volts DC, or a range of 200 to 400 volts DC. The cathode 412 can reach a temperature of at least 500° C., at least 1000° C., or at least 2000° C. during the electric glow discharge. The electrically conductive fluid comprises water, produced water, wastewater, tailings pond water, or other suitable fluid. The electrically conductive fluid can be created by adding an electrolyte, such as baking soda, Nahcolite, lime, sodium chloride, ammonium sulfate, sodium sulfate or carbonic acid, to a fluid.

Figure 5:
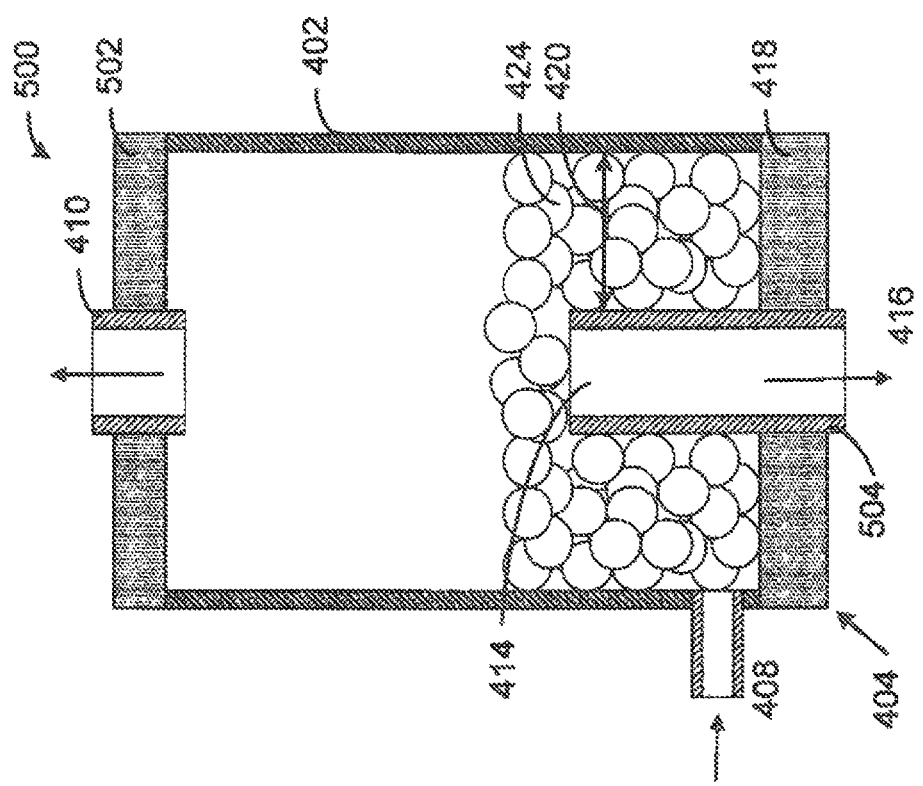
FIG. 5 is a cross-sectional view of a glow discharge cell in accordance with another embodiment of the present invention.

Referring now to FIG. 5, a cross-sectional view of a glow discharge cell 500 in accordance with another embodiment of the present invention is shown. The glow discharge cell 500 includes an electrically conductive cylindrical vessel 402 having a first end 404 and a closed second end 502, an inlet proximate 408 to the first end 404, and an outlet 410 centered in the closed second end 502. A hollow electrode 504 is aligned with a longitudinal axis of the cylindrical vessel and extends at least from the first end 404 into the cylindrical vessel 402. The hollow electrode 504 has an inlet 414 and an outlet 416. A first insulator 418 seals the first end 404 of the cylindrical vessel 402 around the hollow electrode 504 and maintains a substantially equidistant gap 420 between the cylindrical vessel 402 and the hollow electrode 504. A non-conductive granular material 424 is disposed within the gap 420, wherein the non-conductive granular material 424 (a) allows an electrically conductive fluid to flow between the cylindrical vessel 402 and the hollow electrode 504, and (b) prevents electrical arcing between the cylindrical vessel 402 and the hollow electrode 504 during a electric glow discharge. The electric glow discharge is created whenever: (a) the glow discharge cell 500 is connected to an electrical power source such that the cylindrical vessel 402 is an anode and the hollow electrode 504 is a cathode, and (b) the electrically conductive fluid is introduced into the gap 420.

The following examples will demonstrate the capabilities, usefulness and completely unobvious and unexpected results.

Example 1—Black Liquor

Figure 6:
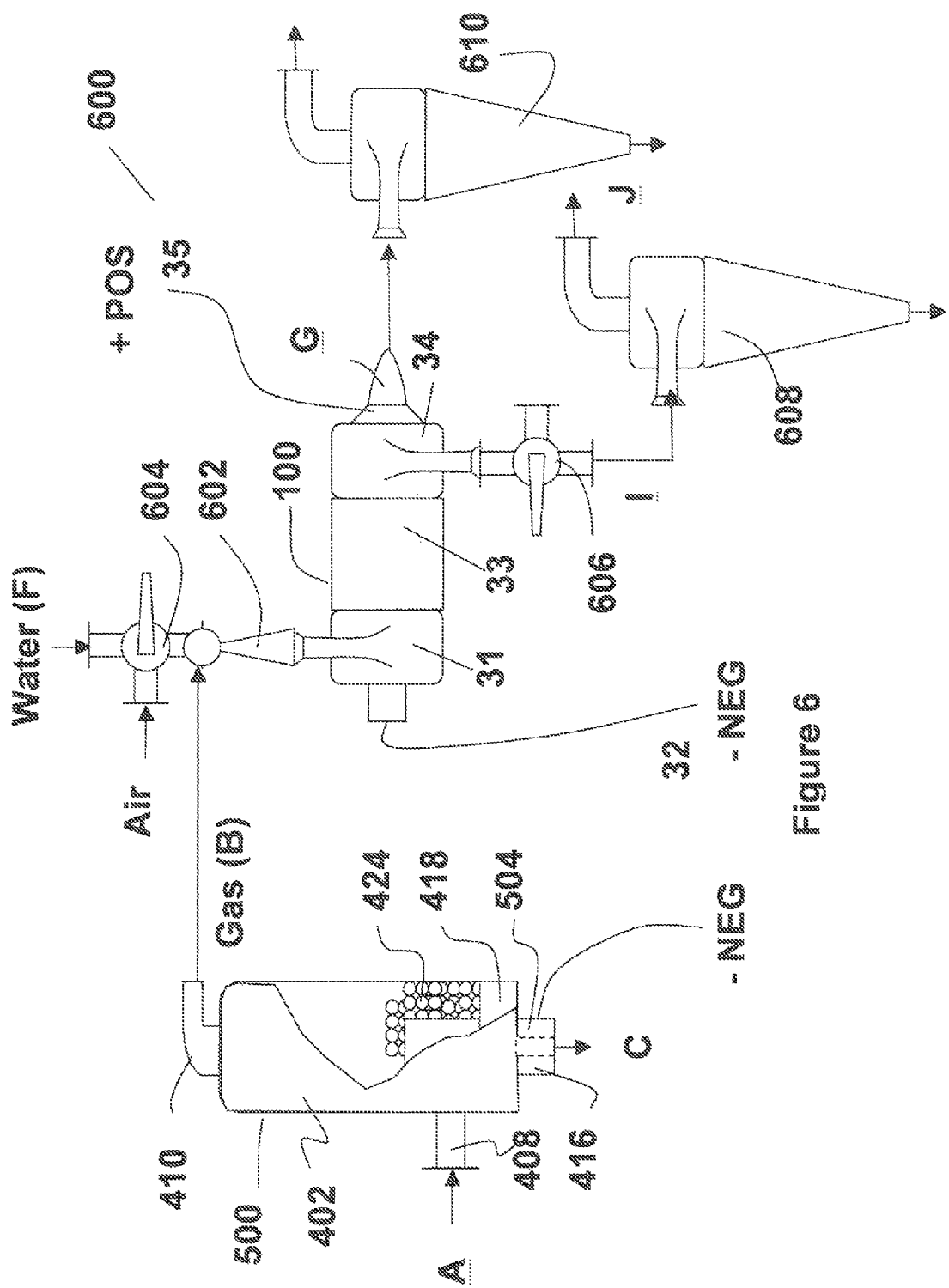
FIG. 6 is a cross-sectional view of a Solid Oxide Plasma Arc Torch System in accordance with another embodiment of the present invention.

Now referring to FIG. 6, a cross-sectional view of a Solid Oxide Plasma Arc Torch System 600 in accordance with another embodiment of the present invention is shown. A plasma arc torch 100 is connected to the cell 500 via an eductor 602. Once again the cell 500 was filled with a baking soda and water solution. A pump was connected to the first volute 31 of the plasma arc torch 100 via a 3-way valve 604 and the eductor 602. The eductor 602 pulled a vacuum on the cell 500. The plasma exiting from the plasma arc torch 100 dramatically increased in size. Hence, a non-condensable gas B was produced within the cell 500. The color of the arc within the plasma arc torch 100 when viewed through the sightglass 33 changed colors due to the gases produced from the HiTemper™ cell 500. Next, the 3-way valve 604 was adjusted to allow air and water F to flow into the first volute 31 of plasma arc torch 100. The additional mass flow increased the plasma G exiting from the plasma arc torch 100. Several pieces of stainless steel round bar were placed at the tip of the plasma G and melted to demonstrate the systems capabilities. Likewise, wood was carbonized by placing it within the plasma stream G. Thereafter the plasma G exiting from the plasma torch 100 was directed into cyclone separator 610. The water and gases I exiting from the plasma arc torch 100 via second volute 34 flowed into a hydrocyclone 608 via a valve 606. This allowed for rapid mixing and scrubbing of gases with the water in order to reduce the discharge of any hazardous contaminants.

A sample of black liquor with 16% solids obtained from a pulp and paper mill was charged to the glow discharge cell 500 in a sufficient volume to cover the floral marbles 424. In contrast to other glow discharge or electro plasma systems the solid oxide glow discharge cell does not require preheating of the electrolyte. The ESAB ESP 150 power supply was turned on and the volts and amps were recorded by hand. Referring briefly to FIG. 3, as soon as the power was turned on to the cell 500, the amp meter pegged out at 150. Hence, the name of the ESAB power supply—ESP 150. It is rated at 150 amps. The voltage was steady between 90 and 100 VDC. As soon as boiling occurred the voltage steadily climbed to OCV (370 VDC) while the amps dropped to 75.

The glow discharge cell 500 was operated until the amps fell almost to zero. Even at very low amps of less than 10 the voltage appeared to be locked on at 370 VDC. The cell 500 was allowed to cool and then opened to examine the marbles 424. It was surprising that there was no visible liquid left in the cell 500 but all of the marbles 424 were coated or coked with a black residue. The marbles 424 with the black residue were shipped off for analysis. The residue was in the bottom of the container and had come off of the marbles 424 during shipping. The analysis is listed in the table below, which demonstrates a novel method for concentrating black liquor and coking organics. With a starting solids concentration of 16%, the solids were concentrated to 94.26% with only one evaporation step. Note that the sulfur ("S") stayed in the residue and did not exit the cell 500.

Total Solids % 94.26
Ash %/ODS 83.64
ICP metal scan: results are reported on ODS basis

TABLE

| Black Liquor Results | | |
|---|---|---|
| Metal Scan | Unit | F80015 |
| Aluminum, Al | mg/kg | 3590* |
| Arsenic, As | mg/kg | <50 |
| Barium, Ba | mg/kg | 2240* |
| Boron, B | mg/kg | 60 |
| Cadmium, Cd | mg/kg | 2 |
| Calcium, Ca | mg/kg | 29100* |
| Chromium, Cr | mg/kg | 31 |
| Cobalt, Co | mg/kg | <5 |
| Copper, Cu | mg/kg | 19 |
| Iron, Fe | mg/kg | 686* |
| Lead, Pb | mg/kg | <20 |
| Lithium, Li | mg/kg | 10 |
| Magnesium, Mg | mg/kg | 1710* |
| Manganese, Mn | mg/kg | 46.2 |
| Molybdenum, Mo | mg/kg | 40 |
| Nickel, Ni | mg/kg | <100 |
| Phosphorus, P | mg/kg | 35 |
| Potassium, K | mg/kg | 7890 |
| Silicon, Si | mg/kg | 157000* |
| Sodium, Na | mg/kg | 102000 |
| Strontium, Sr | mg/kg | <20 |
| Sulfur, S | mg/kg | 27200* |
| Titanium, Ti | mg/kg | 4 |
| Vanadium, V | mg/kg | 1.7 |
| Zinc, Zn | mg/kg | 20 |

This method can be used for concentrating black liquor from pulp, paper and fiber mills for subsequent recaustizing.

As can be seen in FIG. 3, if all of the liquid evaporates from the cell 500 and it is operated only with a solid electrolyte, electrical arc over from the cathode to anode may occur. This has been tested in which case a hole was blown through the stainless steel vessel 402. Electrical arc over can easily be prevented by (1) monitoring the liquid level in the cell and do not allow it to run dry, and (2) monitoring the amps (Low amps=Low liquid level). If electrical arc over is desirable or the cell must be designed to take an arc over, then the vessel 402 should be constructed of carbon.

Example 2—Arcwhirl® Plasma Torch Attached to Solid Oxide Cell

Figure 7:
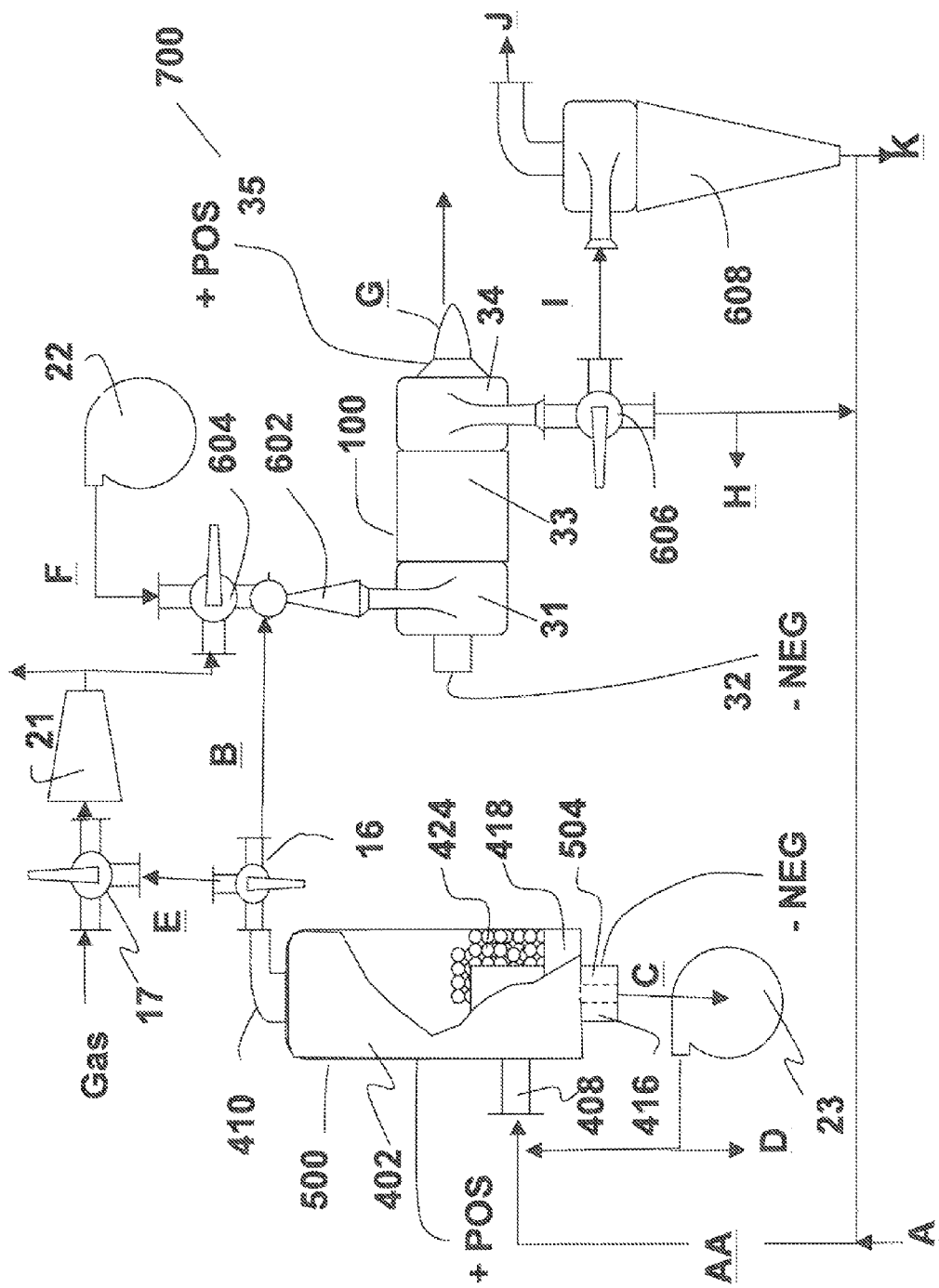
FIG. 7 is a cross-sectional view of a Solid Oxide Plasma Arc Torch System in accordance with another embodiment of the present invention.

Referring now to FIG. 7, a cross-sectional view of a Solid Oxide Plasma Arc Torch System 700 in accordance with another embodiment of the present invention is shown. A plasma arc torch 100 is connected to the cell 500 via an eductor 602. Once again the cell 500 was filled with a baking soda and water solution. Pump 23 recirculates the baking soda and water solution from the outlet 416 of the hollow electrode 504 to the inlet 408 of the cell 500. A pump 22 was connected to the first volute 31 of the plasma arc torch 100 via a 3-way valve 604 and the eductor 602. An air compressor 21 was used to introduce air into the 3-way valve 604 along with water F from the pump 22. The pump 22 was turned on and water F flowed into the first volute 31 of the plasma arc torch 100 and through a full view site glass 33 and exited the torch 30 via a second volute 34. The plasma arc torch 100 was started by pushing a carbon cathode rod (−NEG) 32 to touch and dead short to a positive carbon anode (+POS) 35. A very small plasma G exited out of the anode 35. Next, the High Temperature Plasma Electrolysis Reactor (Cell) 500 was started in order to produce a plasma gas B. Once again at the onset of boiling voltage climbed to OCV (370 VDC) and a gas began flowing to the plasma arc torch 100. The eductor 602 pulled a vacuum on the cell 500. The plasma G exiting from the plasma arc torch 100 dramatically increased in size. Hence, a non-condensable gas B was produced within the cell 500. The color of the arc within the plasma arc torch 100 when viewed through the sightglass 33 changed colors due to the gases produced from the HiTemper™ cell 500. Next, the 3-way valve 604 was adjusted to allow air from compressor 21 and water from pump 22 to flow into the plasma arc torch 100. The additional mass flow increased the plasma G exiting from the plasma arc torch 100. Several pieces of stainless steel round bar were placed at the tip of the plasma G and melted to demonstrate the systems capabilities. Likewise, wood was carbonized by placing it within the plasma stream G. The water and gases exiting from the plasma arc torch 100 via volute 34 flowed into a hydrocyclone 608. This allowed for rapid mixing and scrubbing of gases with the water in order to reduce the discharge of any hazardous contaminants.

Next, the system was shut down and a second cyclone separator 610 was attached to the plasma arc torch 100 as shown in FIG. 5. Once again the Solid Oxide Plasma Arc Torch System was turned on and a plasma G could be seen circulating within the cyclone separator 610. Within the eye or vortex of the whirling plasma G was a central core devoid of any visible plasma.

The cyclone separator 610 was removed to conduct another test. To determine the capabilities of the Solid Oxide Plasma Arc Torch System as shown in FIG. 6, the pump 22 was turned off and the system was operated only on air provided by compressor 21 and gases B produced from the solid oxide cell 500. Next, 3-way valve 606 was slowly closed in order to force all of the gases through the arc to form a large plasma G exiting from the hollow carbon anode 35.

Next, the 3-way valve 604 was slowly closed to shut the flow of air to the plasma arc torch 100. What happened was completely unexpected. The intensity of the light from the sightglass 33 increased dramatically and a brilliant plasma was discharged from the plasma arc torch 100. When viewed with a welding shield the arc was blown out of the plasma arc torch 100 and wrapped back around to the anode 35. Thus, the Solid Oxide Plasma Arc Torch System will produce a gas and a plasma suitable for welding, melting, cutting, spraying and chemical reactions such as pyrolysis, gasification and water gas shift reaction.

Example 3—Phosphogypsum Pond Water

The phosphate industry has truly left a legacy in Florida, Louisiana and Texas that will take years to cleanup—gypsum stacks and pond water. On top of every stack is a pond. Pond water is recirculated from the pond back down to the plant and slurried with gypsum to go up the stack and allow the gypsum to settle out in the pond. This cycle continues and the gypsum stack increases in height. The gypsum is produced as a byproduct from the ore extraction process.

There are two major environmental issues with every gyp stack. First, the pond water has a very low pH. It cannot be discharged without neutralization. Second, the phosphogypsum contains a slight amount of radon. Thus, it cannot be used or recycled to other industries. The excess water in combination with ammonia contamination produced during the production of $P_2O_5$ fertilizers such as diammonium phosphate ("DAP") and monammonium phosphate ("MAP") must be treated prior to discharge. The excess pond water contains about 2% phosphate a valuable commodity.

A sample of pond water was obtained from a Houston phosphate fertilizer company. The pond water was charged to the solid oxide cell 500. The Solid Oxide Plasma Arc Torch System was configured as shown in FIG. 6. The 3-way valve 606 was adjusted to flow only air into the plasma arc torch 100 while pulling a vacuum on cell 500 via eductor 602. The hollow anode 35 was blocked in order to maximize the flow of gases I to hydrocyclone 608 that had a closed bottom with a small collection vessel. The hydrocyclone 608 was immersed in a tank in order to cool and recover condensable gases.

The results are disclosed in FIG. 10—Tailings Pond Water Results. The goal of the test was to demonstrate that the Solid Oxide Glow Discharge Cell could concentrate up the tailings pond water. Turning now to cycles of concentration, the percent $P_2O_5$ was concentrated up by a factor of 4 for a final concentration of 8.72% in the bottom of the HiTemper™ cell 500. The beginning sample as shown in the picture is a colorless, slightly cloudy liquid. The bottoms or concentrate recovered from the HiTemper cell 500 was a dark green liquid with sediment. The sediment was filtered and are reported as SOLIDS (Retained on Whatmann #40 filter paper). The percent $SO_4$ recovered as a solid increased from 3.35% to 13.6% for a cycles of concentration of 4. However, the percent Na recovered as a solid increased from 0.44% to 13.67% for a cycles of concentration of 31.

The solid oxide or solid electrolyte 424 used in the cell 500 were floral marbles (Sodium Oxide). Floral marbles are made of sodium glass. Not being bound by theory it is believed that the marbles were partially dissolved by the phosphoric acid in combination with the high temperature glow discharge. Chromate and Molydemun cycled up and remained in solution due to forming a sacrificial anode from the stainless steel vessel 402. Note: Due to the short height of the cell carryover occurred due to pulling a vacuum on the cell 500 with eductor 602. In the first run (row 1 HiTemper) of FIG. 10 very little fluorine went overhead. That had been a concern from the beginning that fluorine would go over head. Likewise about 38% of the ammonia went overhead. It was believed that all of the ammonia would flash and go overhead.

A method has been disclosed for concentrating $P_2O_5$ from tailings pond for subsequent recovery as a valuable commodity acid and fertilizer.

Now, returning back to the black liquor sample, not being bound by theory it is believed that the black liquor can be recaustisized by simply using CaO or limestone as the solid oxide electrolyte 424 within the cell 500. Those who are skilled in the art of producing pulp and paper will truly understand the benefits and cost savings of not having to run a lime kiln. However, if the concentrated black liquor must be gasified or thermally oxidized to remove all carbon species, the marbles 424 can be treated with the plasma arc torch 100. Referring back to FIG. 6, the marbles 424 coated with the concentrated black liquor or the concentrated black liquor only is injected between the plasma arc torch 100 and the cyclone separator 610. This will convert the black liquor into a green liquor or maybe a white liquor. The marbles 424 may be flowed into the plasma arc torch nozzle 31 and quenched in the whirling lime water and discharged via volute 34 into hydrocyclone 608 for separation and recovery of both white liquor and the marbles 424. The lime will react with the NaO to form caustic and an insoluble calcium carbonate precipitate.

Example 4—Evaporation, Vapor Compression and Steam Generation for EOR and Industrial Steam Users Turning to FIG. 4, several oilfield wastewaters were evaporated in the cell 400. In order to enhance evaporation the suction side of a vapor compressor (not shown) can be connected to upper outlet 410. The discharge of the vapor compressor would be connected to 416. Not being bound by theory, it is believed that alloys such as Kanthal® manufactured by the Kanthal® corporation may survive the intense effects of the cell as a tubular cathode 412, thus allowing for a novel steam generator with a superheater by flowing the discharge of the vapor compressor through the tubular cathode 412. Such an apparatus, method and process would be widely used throughout the upstream oil and gas industry in order to treat oilfield produced water and frac flowback.

Several different stainless steel tubulars were tested within the cell 500 as the cathode 12. In comparison to the sheath glow discharge the tubulars did not melt. In fact, when the tubulars were pulled out, a marking was noticed at every point a marble was in contact with the tube.

This gives rise to a completely new method for using glow discharge to treat metals.

Example 5—Treating Tubes, Bars, Rods, Pipe or Wire

There are many different companies applying glow discharge to treat metal. However, many have companies have failed miserably due to arcing over and melting the material to be coated, treated or descaled. The problem with not being able to control voltage leads to spikes. By simply adding sand or any solid oxide to the cell and feeding the tube cathode 12 through the cell 500 as configured in FIG. 2, the tube, rod, pipe, bars or wire can be treated at a very high feedrate.

Example 6—Solid Oxide Plasma Arc Torch

There truly exists a need for a very simple plasma torch that can be operated with dirty or highly polluted water such as sewage flushed directly from a toilet which may contain toilet paper, feminine napkins, fecal matter, pathogens, urine and pharmaceuticals. A plasma torch system that could operate on the aforementioned waters could potentially dramatically affect the wastewater infrastructure and future costs of maintaining collection systems, lift stations and wastewater treatment facilities.

By converting the contaminated wastewater to a gas and using the gas as a plasma gas could also alleviate several other growing concerns—municipal solid waste going to landfills, grass clippings and tree trimmings, medical waste, chemical waste, refinery tank bottoms, oilfield wastes such as drill cuttings and typical everyday household garbage. A simple torch system which could handle both solid waste and liquids or that could heat a process fluid while gasifying biomass or coal or that could use a wastewater to produce a plasma cutting gas would change many industries overnight.

One industry in particular is the metals industry. The metals industry requires a tremendous amount of energy and exotic gases for heating, melting, welding, cutting and machining.

Figure 8:
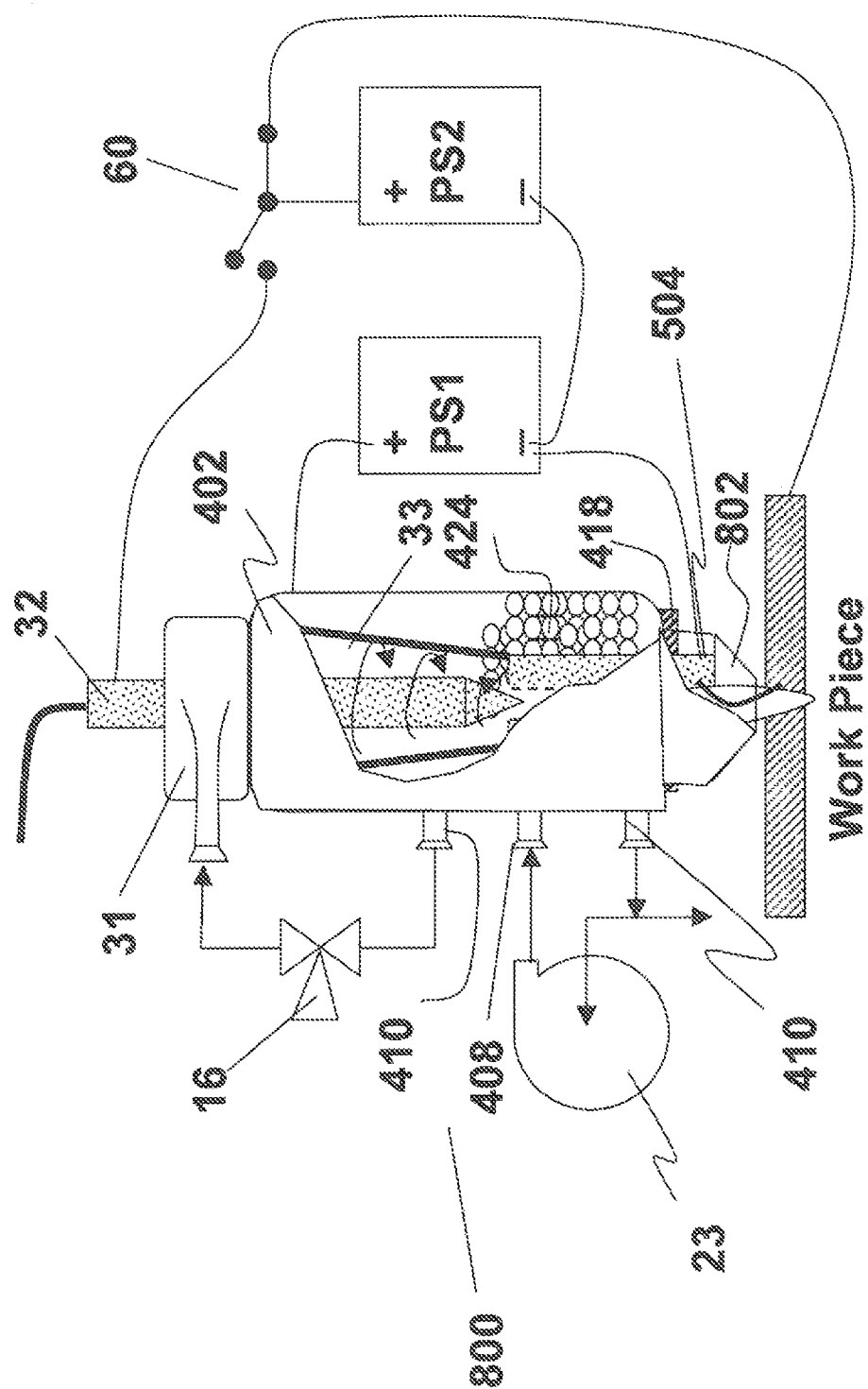
FIG. 8 is a cross-sectional view of a Solid Oxide Transferred Arc Plasma Torch in accordance with another embodiment of the present invention.
Figure 9:
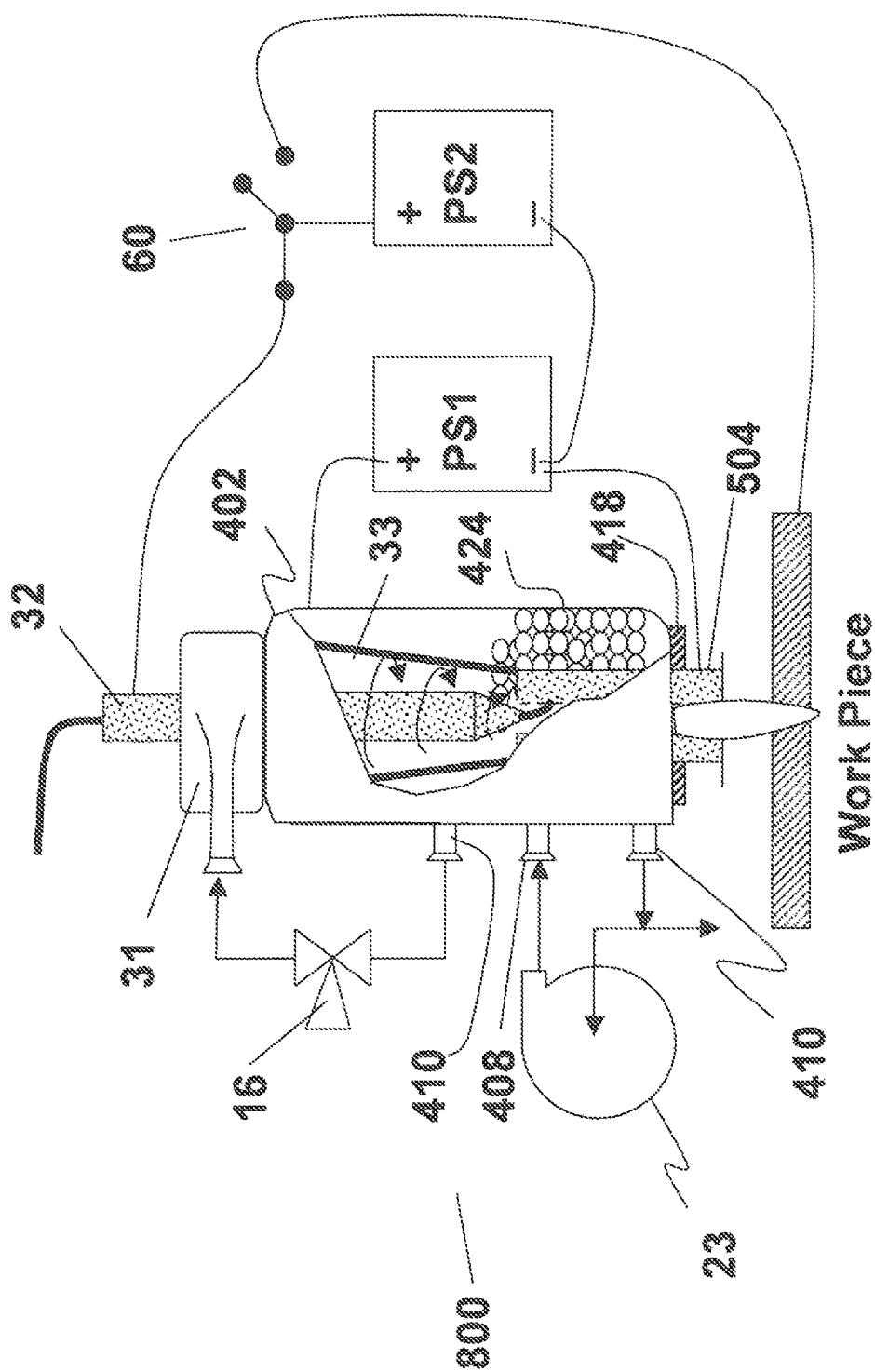
FIG. 9 is a cross-sectional view of a Solid Oxide Non-Transferred Arc Plasma Torch in accordance with another embodiment of the present invention.

Turning now to FIGS. 8 and 9, a truly novel plasma torch 800 will be disclosed in accordance with the preferred embodiments of the present invention. First, the Solid Oxide Plasma Torch is constructed by coupling the plasma arc torch 100 to the cell 500. The plasma arc torch volute 31 and electrode 32 are detached from the eductor 602 and sightglass 33. The plasma arc torch volute 31 and electrode assembly 32 are attached to the cell 500 vessel 402. The sightglass 33 is replaced with a concentric type reducer 33. It is understood that the electrode 32 is electrically isolated from the volute 31 and vessel 402. The electrode 32 is connected to a linear actuator (not shown) in order to strike the arc.

Continuous Operation of the Solid Oxide Transferred Arc Plasma Torch 800 as shown in FIG. 8 will now be disclosed for cutting or melting an electrically conductive workpiece. A fluid is flowed into the suction side of the pump and into the cell 500. The pump is stopped. A first power supply PS1 is turned on thus energizing the cell 500. As soon as the cell 500 goes into glow discharge and a gas is produced valve 16 opens allowing the gas to enter into the volute 31. The volute 31 imparts a whirl flow to the gas. A switch 60 is positioned such that a second power supply PS2 is connected to the workpiece and the −negative side of PS2 is connected to the −negative of PS1 which is connected to the centered cathode 504 of the cell 500. The entire torch is lowered so that an electrically conductive nozzle 13-C touches and is grounded to the workpiece. PS2 is now energized and the torch is raised from the workpiece. An arc is formed between cathode 504 and the workpiece.

Centering the Arc—If the arc must be centered for cutting purposes, then PS2's—negative lead would be attached to the lead of switch 60 that goes to the electrode 32. Although a series of switches are not shown for this operation, it will be understood that in lieu of manually switching the negative lead from PS2 an electrical switch similar to 60 could be used for automation purposes. The +positive lead would simply go to the workpiece as shown. A smaller electrode 32 would be used such that it could slide into and through the hollow cathode 504 in order to touch the workpiece and strike an arc. The electrically conductive nozzle 802 would be replaced with a non-conducting shield nozzle. This setup allows for precision cutting using just wastewater and no other gases.

Turning to FIG. 9, the Solid Oxide Non-Transferred Arc Plasma Torch 800 is used primarily for melting, gasifying and heating materials while using a contaminated fluid as the plasma gas. Switch 60 is adjusted such that PS2 +lead feeds electrode 32. Once again electrode 32 is now operated as the anode. It must be electrically isolated from vessel 402. When gas begins to flow by opening valve 16 the volute 31 imparts a spin or whirl flow to the gas. The anode 32 is lowered to touch the centered cathode 504. An arc is formed between the cathode 32 and anode 504. The anode may be hollow and a wire may be fed through the anode 504 for plasma spraying, welding or initiating the arc.

The entire torch is regeneratively cooled with its own gases thus enhancing efficiency. Likewise, a waste fluid is used as the plasma gas which reduces disposal and treatment costs. Finally, the plasma may be used for gasifying coal, biomass or producing copious amounts of syngas by steam reforming natural gas with the hydrogen and steam plasma.

Both FIGS. 8 and 9 have clearly demonstrated a novel Solid Oxide Plasma Arc Torch that couples the efficiencies of high temperature electrolysis with the capabilities of both transferred and non-transferred arc plasma torches.

Example 7—Water/Wastewater Treatment

Chemicals are being discovered in water that previously had not been detected or are being detected at levels that may be significantly different than expected. These are often generally referred to as "contaminants of emerging concern" (CECs) because the risk to human health and the environment associated with their presence, frequency of occurrence, or source may not be known. U.S. Environmental Protection Agency ("EPA") is working to improve its understanding of a number of CECs, particularly pharmaceuticals and personal care products (PPCPs) and perfluorinated compounds among others. Pharmaceuticals refer to prescription and over-the-counter therapeutic drugs and veterinary drugs. Personal care products refer to products used for personal and cosmetic reasons such as soaps, fragrances, and cosmetics.

The last decade has seen increased documentation of trace concentrations (low parts-per-trillion) levels of PPCPs in surface water, groundwater, and finished drinking water. While PPCPs can originate from numerous sources, effluents from wastewater treatment plants (WWTPs) have been identified as a significant source to surface waters. PPCPs can enter WWTPs when people excrete pharmaceutical products or their metabolites, or flush unused medications down a drain or sewer system. The pharmaceutical drugs that have been detected nationally comprise a large range of emerging drinking water contaminants, including prescription and over-the-counter drugs, antibiotics, tranquilizers, antidepressants, and other organic chemicals. The personal care products that have been detected include but are not limited to: fragrances, disinfectants, sunscreen, preservatives, and surfactants or their metabolites. See: 2010 Occurrence of Pharmaceutical and Personal Care Products (PPCPs) in Source Water of the New York City Water Supply— http://www.nyc.gov/html/dep/pdf/quality/ nyc_dep_2010_ppcpreport.pdf; and Kolpin D W, Furlong E T, Meyer M T, Thurman E M, Zaugg S D, Barber L B, et al. 2002.—Pharmaceuticals, hormones, and other organic wastewater contaminants in U.S. streams, 1999-2000: a national reconnaissance. Environmental Science and Technology 36(6): 1202-11.

The EPA defines PPCPs as pollutants in general, to any product used by individuals for personal health or cosmetic reasons or used by agribusiness to enhance growth or health of livestock. PPCPs comprise a diverse collection of thousands of chemical substances, including prescription and over-the-counter therapeutic drugs, veterinary drugs, fragrances, and cosmetics. Research suggests that certain drugs may cause ecological harm. PPCPs have probably been present in water and the environment for as long as humans have been using them. The drugs that we take are not entirely absorbed by our bodies, and are excreted and passed into wastewater and surface water. With advances in technology that improved the ability to detect and quantify these chemicals, we can now begin to identify what effects, if any, these chemicals have on human and environmental health. The number of PPCPs is growing. In addition to antibiotics and steroids, over 100 individual PPCPs have been identified (as of 2007) in environmental samples and drinking water. The EPA has stated that sewage systems are not equipped for PPCP removal and that there are no municipal sewage treatment plants that are engineered specifically for PPCP removal or for other unregulated contaminants. Effective removal of PPCPs from treatment plants varies based on the type of chemical and on the individual sewage treatment facilities.

Figure 11:
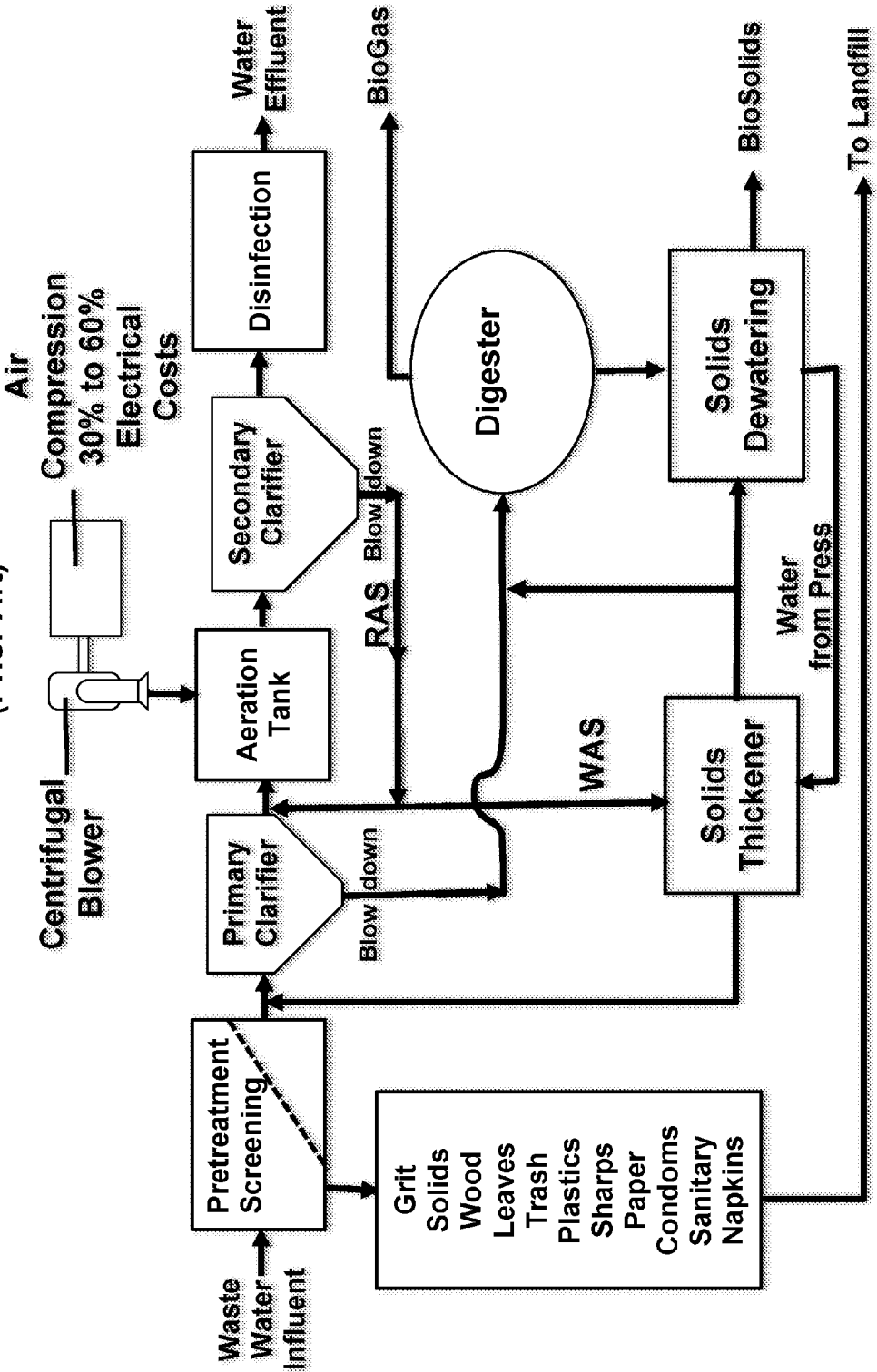
FIG. 11 is block diagram of a water/wastewater treatment plant in accordance with the prior art.

Referring to FIG. 11, a typical activated sludge wastewater treatment plant is shown that will not remove PPCPs and effluent is not suitable for recycling and reuse. Turning now to FIG. 12 while referring to FIGS. 1, 4, 5, 6 and 7, and specifically units 100, 400, 500, 600 and 700, a wastewater treatment plant can be modified and retrofitted for treating emerging contaminants and or polishing wastewater for reuse.

First, waste water influent may be pretreated by installation of either unit 400 or 500 as shown in FIGS. 4 and 5 respectively. Activated carbon as previously disclosed would be the ideal filtration media for the glow discharge cell. Units 400 and 500 are operated as normal activated carbon filters until the carbon is spent.

The activated carbon can be regenerated with the glow discharge plasma cell. Consequently, by using two or more filters, one can be online while the other is being reactivated. To reactive the carbon the power supply is turned ON, and the carbon is allowed to heat up and generate steam in situ from the remaining wastewater or by adding an electrolyte. The electrolyte may be chosen from any of the aforementioned electrolytes and specifically, phosphoric acid may be generated from another glow discharge cell and used for reactivating carbon in addition to steam. The present invention allows for onsite reactivation of spent activated carbon. Furthermore as previously disclosed, the present invention's glow discharge cell will produce steam and hydrogen for flowing to Plasma ArcWhirl® Torch 100 as shown in FIGS. 6 and 7 for use as a plasma gas.

While still referring to FIG. 12 wastewater may be polished for removal of PPCPs by installation of Unit 700 as shown in FIG. 7. Turning now to FIG. 7 wastewater F is flowed into the Plasma ArcWhirl® Torch 100 via a 3-way mixing valve 604 and may used as the motive fluid in eductor 602. A Gas flows into 3-way valve 17 and into a compressor 21. Compressed gas is then flowed into the 3-way mixing valve 604.

As previously disclosed a thin film of whirling water is created by introduction of the gas with the water into the Plasma ArcWhirl® 100. The water is exposed directly to an intense source of ElectroMagnetic Radiation ("EMR") emitted from both the plasma and the carbon electrode. In addition, ozone is generated from the electrical arc and is partially mixed with the water when exiting via volute 34. Likewise, since the system is grounded if there is sufficient electrical conductivity in the water, then the water may be treated via electrolysis also.

Turning now to FIG. 1, a unique and extremely novel regeneratively cooled plasma torch will be demonstrated for treating water while also generating Char via Plasma 108. A combination of a Gas and a Fluid (Water) 110 is flowed into the Plasma ArcWhirl® Torch 100 in order to maintain a gas only discharge from the hollow electrode nozzle. When the unit is turned ON a Plasma 108 discharges from the hollow electrode nozzle 106. The ArcWhirl® is cooled by the water whirling within the vessel 104. Hence, the ArcWhirl® Torch 100 is regeneratively cooled with the water it is treating via EMR, Ozone and electrolysis while also producing an extremely hot plasma discharge. The hot plasma discharge is used to convert carbonaceous matter to Char and syngas.

Turning now to FIG. 6, the system would be arranged such that the plasma discharges into a cyclone separator 610 and Biomass or hydrocarbon feedstock is fed between the ArcWhirl® Torch 100 and the Cyclone Separator 610. Char is discharged thru the underflow of the cyclone separator 610 while hot syngas exits the overflow of the cyclone separator 610. If biomass is used, then it is referred to as BioChar. By treating the BioChar with the plasma at extreme temperatures it is converted to activated Plasma BioChar™.

Once again the Plasma Activated BioChar™ would be used as the media within the glow discharge cell as shown in FIG. 4 or 5. Now returning to FIG. 7, wastewater exits from the ArcWhirl® Torch 100 via volute 34 and thru 3-way valve 606 and is flowed into the glow discharge cell 500 as shown by line AA. The Glow Discharge Cell may be configured as shown in either FIG. 4 or 5. Ozonated wastewater is then filtered through the Plasma Activated BioChar media and is discharged as shown by C. A novel water treatment system has been disclosed that couples Plasma Arc Water Treatment utilizing EMR and Ozone in addition to activated carbon.

It will be understood that many drinking water and wastewater treatment plants that operated 24/7 would incorporate at least two complete systems as shown in FIGS. 6 and 7 and/or modifications thereof for redundancy as well as allowing reactivation of spent carbon. If three are more Plasma ArcWhirl® Torches are tangentially aligned to discharge into a common vessel, then this configuration would make an ideal PlasmaWhirl® Reactor as disclosed in FIG. 1 of U.S. Pat. No. 7,622,693 which is hereby incorporated by reference in its entirety.

Energy Generation and Recovery for the WATER-ENERGY NEXUS

Water and wastewater treatment plants could be operated off-the-grid by converting carbonaceous matter into syngas and char with the present invention. This transformational approach could be responsible for saving as much as 4% of the total electrical power generated within the US.

As previously disclosed wood has been carbonized with the Plasma ArcWhirl® Torch 100 using a plasma gas generated from the Glow Discharge Cell 500 configured as shown in FIG. 7. In addition, recent testing has shown that the gases exiting from the Plasma ArcWhirl® Torch 100 using baking soda within the Glow Discharge Cell 500 as the plasma gas produced a plasma G temperature of 2,900° C. (5,250° F.) as measured with an optical pyrometer. Likewise, sawdust was flowed directly into the steam/hydrogen plasma G and were formed producing syngas with a composition shown in the following SYNGAS TABLE:

| Component | Sample 1 Concentration % | Sample 2 Concentration % | Sample 3 Concentration % |
|---|---|---|---|
| $H_2$ | 38.702591 | 23.993687 | 31.965783 |
| $O_2$ | 7.603821 | 3.777238 | 5.671720 |
| $N_2$ | 5.730443 | 4.424545 | 4.803373 |
| $CH_4$ | 1.042843 | 3.770582 | 2.923456 |
| CO | 9.465042 | 14.879737 | 10.633168 |
| $CO_2$ | 30.015818 | 33.110154 | 32.207613 |
| $H_2/CO$ | 4.08/1 | 1.61/1 | 3.01/1 |

The syngas produced from the present invention is now ready for lean combustion with the Plasma ArcWhirl® Turbine as disclosed in U.S. Pat. No. 8,074,439. Likewise, it will be understood that the syngas can be converted to liquid biofuels using a Fischer Tropschs catalyst or any suitable process and/or catalyst that will convert syngas to liquid fuels.

Syngas and/or a hot gas and char are produced from the Plasma ArcWhirl® Torch's plasma plume G. The hot syngas and/or hot gas is used to rotate a turbine that is connected to a compressor, pump, generator and/or mixer. Referring to U.S. Pat. No. 8,074,439 the Plasma ArcWhirl® Turbine '439 may be operated in a lean combustion mode to simply drive a turbocharger for providing compressed air for aeration purposes.

Integrally Geared Centrifugal Compressors and High Speed Turbo Blowers

Figures 2, 3, 13:
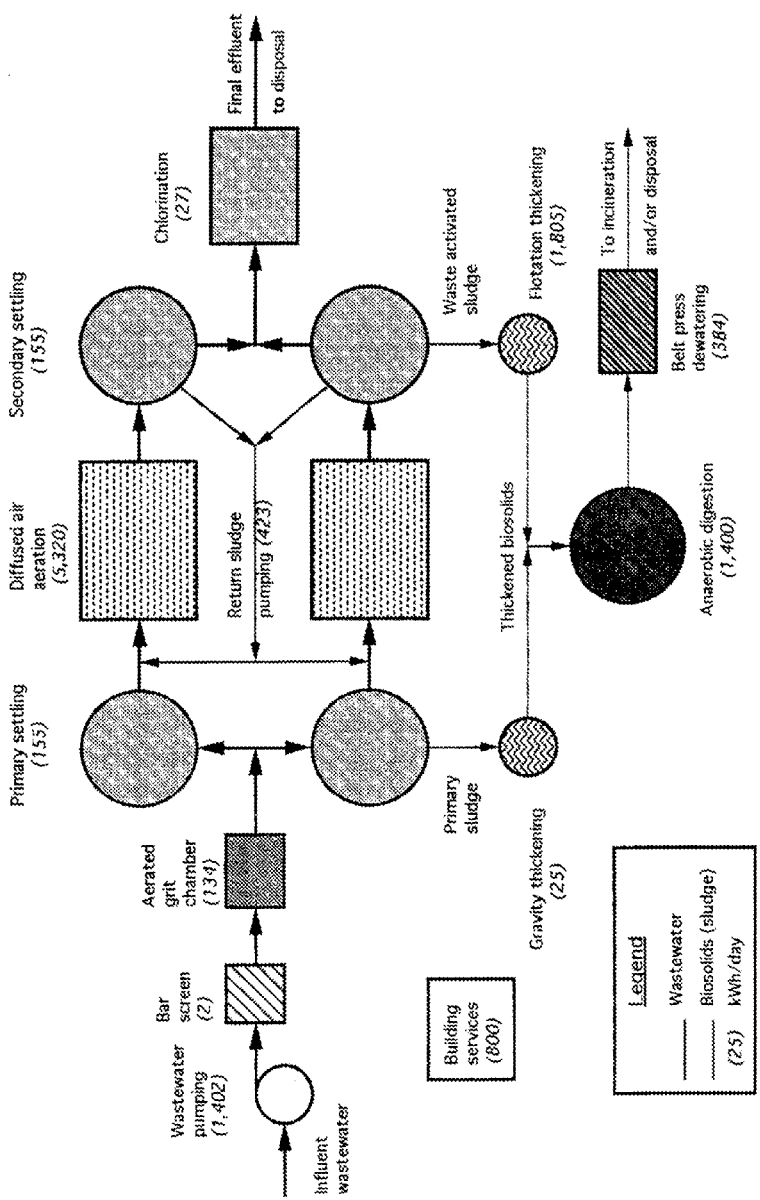
FIG. 13 is a flow diagram of representative activated sludge wastewater treatment process sequence in accordance with the prior art.

Turning now to FIG. 13, a 10 million gallons/day ("MGD") facility is shown with daily electricity consumption. Diffused Air Aeration shows 5,320 kwh/day as the largest consumer of electricity. It is well known that the largest energy user within an activated sludge wastewater plant is aeration. Many WWTP's are replacing aging blowers with more efficient Integrally Geared Centrifugal Compressors and/or High Speed Turbo Blowers. Integrally Geared Centrifugal Blowers and High Speed Turbos are 70% to 80% efficient and have turn downs of 45% to 50%. High speed gearless turbos currently being applied within the Wastewater Industry are basically nothing more than standard vehicle and off road turbochargers modified with a high speed motor.

The present invention's Plasma ArcWhirl® Turbine is an alternative to these blowers. In addition, present invention also provides UV disinfection. As explained in U.S. Pat. No. 7,422,695 which is hereby incorporated by reference in its entirety, there are several major drawbacks to utilizing current UV light disinfection systems. All of the various embodiments of the ArcWhirl® devices can be modified to blow a plasma out of an electrode nozzle.

The present invention's Plasma ArcWhirl® Torch 100 as shown in FIGS. 1, 5, 6, 7, 8 and 9 are completely game changing and transformational for the wastewater industry for many reasons. However, in comparing and contrasting the operational and life cycle costs to traditional UV light system, well there isn't really much of a comparison. The two technologies differ dramatically, in that the Plasma ArcWhirl® Torch does not contain any glass nor any mercury. Thus, from a sustainable technology point of view there is NO comparison. From a lifecycle cost, there is no disposal of lamps, since the technology uses consumable graphite electrodes. Keeping in mind that graphite electrodes are made from carbon, in particularly pet coke, any carbon material can be transformed into a graphite electrode. However, since coke is a FUEL, then the costs of the electrode is offset by its fuel value.

Returning now to FIG. 12 of the present invention, the Plasma ArcWhirl® Turbine is installed and shown by a dotted line. It replaces a wastewater treatment plants blower with either a turbocharger as shown in FIG. 6—Thermal Oxidizer—of the '439 patent or as an integrally geared superturbocharger as disclosed in FIG. 3, 4 or 5 for conversion to rotational energy. This configuration can disinfect wastewater while gasifying biosolids and biogas for lean combustion. Referring to FIG. 2, inlet 202C of '439 patent can be used as an entry for biosolids and any other type of carbonaceous matter.

By coupling four systems of the present invention as shown in FIG. 6 or 7 with the plasma plume G blowing into a ceramic lined vessel, a world class size BioChar and water treatment system can easily be configured as a PlasmaWhirl® Reactor as shown in the FIG. 1 of the '693 patent and disclosed as FIG. 14 of the present invention. Thus, by constructing each ArcWhirl® to flow 1,800 gpm this equals to 10 MGD, in which FIG. 13 discloses that about 5,320 kw-hr are required per day for a 10 MGD facility for aeration purposes alone. This equates to about 221 kw-hr. 2000 lbs/hour of biomass will produce about 1 MW-hr of electricity. Consequently, the present invention demonstrates a net power output by driving a high speed gearless turbo connected to a motor generator or an integrally geared turbine and compressor connected to a motor generator.

In a smaller version rated at 35 kw but operated at only 9 kw-hr, woodchips were converted to Plasma BioChar® by operating the present invention coupled to the '439 patent Thermal Oxidizer of FIG. 6. Thus, by simply using the Plasma Plume of 100 to gasify woodchips, the carbon in the wood is sequestered as a usable form of BioChar for water treatment. The off-gas temperature was measured at over 900° C. and dumped directly into a recirculating water bath. The total process demonstrated that for every 1 kw of out of the wall power, 2 kw of power could be recovered within the water as hot water. Thus, this clearly demonstrates that the present invention is capable of providing aeration, UV, Ozone, and thermal disinfection of water with reduced electrical loading plus the production of Biochar in one system. Furthermore, the production of BioChar is a means for sequestering carbon.

The Biochar produced from the present invention was visually analyzed and determined to be a suitable BioChar for water treatment purposes. Consequently, as previously disclosed the Plasma BioChar™ could be used as the media for the glow discharge cell as shown in FIGS. 4 and 5 of the present invention. This now closes the loop for providing a transformational and completely novel water treatment system that produces and reactivates its own carbon while providing rotational energy, UV light, Ozone and hot gases.

Finally, the present invention provides a method for UV disinfection, ozone disinfection, thermal mixing, Char production, activated carbon reactivation and supersonic lean fuel combustion by creating an electric arc, generating a water and gas whirl flow to confine a plasma from the electric arc, generating a combustion air whirl flow, extracting a rotational energy from one or more hot gases, recuperating energy from the hot gases, and utilizing the electrical arc for water treatment while converting carbonaceous matter to Char and syngas while confining the plasma to the vortex of the whirling combustion air in order to maintain and hold a flame for supersonic combustion while coupled to a means for extracting rotational energy from the hot lean combustion exhaust gas while directly recuperating mixing energy by discharge of the hot exhaust from a turbine into wastewater influent while flowing disinfected water into an activated carbon glow discharge filter for water reuse and recycle.

The foregoing description of the apparatus and methods of the invention in preferred and alternative embodiments and variations, and the foregoing examples of processes for which the invention may be beneficially used, are intended to be illustrative and not for purpose of limitation. The invention is susceptible to still further variations and alternative embodiments within the full scope of the invention, recited in the following claims.

What is claimed is:
1. A system comprising:
a glow discharge cell comprising:
an electrically conductive cylindrical vessel having a first end and a closed second end, an inlet proximate to the first end, and an outlet centered in the closed second end,
a hollow electrode aligned with a longitudinal axis of the electrically conductive cylindrical vessel and extending at least from the first end into the electrically conductive cylindrical vessel, wherein the hollow electrode has an inlet and an outlet,
a first insulator that seals the first end of the electrically conductive cylindrical vessel around the hollow electrode and maintains a substantially equidistant gap between the electrically conductive cylindrical vessel and the hollow electrode, and
a non-conductive granular material disposed within the substantially equidistant gap, wherein the non-conductive granular material allows an electrically conductive fluid to flow between the electrically conductive cylindrical vessel and the hollow electrode, and the combination of the non-conductive granular material and the electrically conductive fluid prevents electrical arcing between the cylindrical vessel and the hollow electrode during an electric glow discharge;
a plasma arc torch comprising:
a cylindrical vessel having a first end and a second end,
a tangential inlet connected to or proximate to the first end,
a tangential outlet connected to or proximate to the second end,
an electrode housing connected to the first end of the cylindrical vessel such that a first electrode is (a) aligned with a longitudinal axis of the cylindrical vessel, and (b) extends into the cylindrical vessel,
a hollow electrode nozzle connected to the second end of the cylindrical vessel such that the center line of the hollow electrode nozzle is aligned with the longitudinal axis of the cylindrical vessel, and
wherein the tangential inlet and the tangential outlet create a vortex within the cylindrical vessel, and the first electrode and the hollow electrode nozzle create a plasma that discharges through the hollow electrode nozzle;
a linear actuator connected to the first electrode of the plasma arc torch to adjust a position of the first electrode within the cylindrical vessel along the longitudinal axis of the cylindrical vessel;
a pump connected to a wastewater source;
a first valve connected to the pump;
a compressed gas source connected to the first valve;
a third valve connected between the outlet of the electrically conductive cylindrical vessel;
an eductor having a first inlet, a second inlet and an outlet, wherein the first inlet is connected to the third valve, the second inlet is connected to the first valve, and the outlet is connected to the tangential inlet of the plasma arc torch; and
a second valve connected between the tangential outlet of the plasma arc torch and the inlet of the glow discharge cell, such that the plasma arc torch provides the electrically conductive fluid to the glow discharge cell and the glow discharge cell provides a treated water via the outlet centered in the closed second end.
2. The system as recited in claim 1, wherein the non-conductive granular material is biochar, marbles, ceramic beads, molecular sieve media, sand, limestone, activated carbon, zeolite, zirconium, alumina, rock salt, nut shells or wood chips.

3. The system as recited in claim 1, further comprising a DC electrical power supply electrically connected to:
- the glow discharge cell such that the electrically conductive cylindrical vessel is an anode and the hollow electrode is a cathode; and
- the plasma arc torch such that the first electrode is the anode and the hollow electrode nozzle is the cathode.

4. The system as recited in claim 3, wherein the glow discharge cell and the plasma arc torch have separate DC electrical power supplies.

5. The system as recited in claim 1, wherein the compressed gas source is a gas compressor.

6. The system as recited in claim 1, wherein the plasma from the plasma arc torch is used for pyrolysis, gasification or water gas shift reactions.

7. The system as recited in claim 6, wherein the gasification comprises gasifying a biomass.

8. The system as recited in claim 6, wherein the water gas shift reactions comprise producing syngas by a steam reforming process.

9. The system as recited in claim 1, further comprising a pump disposed between the outlet of the hollow electrode and the inlet of the electrically conductive cylindrical vessel.

10. The system as recited in claim 1, further comprising a cyclone separator connected to the hollow electrode nozzle of the plasma arc torch.

11. The system as recited in claim 6, further comprising a hydrocyclone connected to the second valve.

\* \* \* \* \*